(12) United States Patent
Kawauchi et al.

(10) Patent No.: US 8,373,992 B2
(45) Date of Patent: Feb. 12, 2013

(54) TRANSMISSION/RECEPTION OPTICAL MODULE

(75) Inventors: Hidetaka Kawauchi, Hitachi (JP); Yoshiaki Ishigami, Hitachi (JP); Yoshinori Sunaga, Hitachinaka (JP); Hiroki Katayama, Hitachi (JP); Akihiro Hiruta, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 102 days.

(21) Appl. No.: 13/098,774

(22) Filed: May 2, 2011

(65) Prior Publication Data

US 2011/0267784 A1    Nov. 3, 2011

Related U.S. Application Data

(62) Division of application No. 10/962,450, filed on Oct. 13, 2004, now Pat. No. 7,948,760.

(30) Foreign Application Priority Data

Jan. 30, 2004    (JP) .................................. 2004-023846

(51) Int. Cl.
*H05K 1/00* (2006.01)

(52) U.S. Cl. .............................. 361/749; 385/90; 385/92

(58) Field of Classification Search .................. 361/749; 385/90, 92
See application file for complete search history.

(56) References Cited

U.S. PATENT DOCUMENTS

| 388,411 | A | | 8/1888 | Sashinaka, Et Al. |
|---|---|---|---|---|
| 3,971,127 | A | | 7/1976 | Giguere et al. |
| 5,742,480 | A | | 4/1998 | Sawada et al. |
| 5,963,693 | A | * | 10/1999 | Mizue et al. ..................... 385/88 |
| 6,445,475 | B1 | | 9/2002 | Okubora et al. |
| 6,454,467 | B1 | * | 9/2002 | Ishihara et al. ................. 385/88 |
| 6,739,764 | B2 | | 5/2004 | Ido et al. |
| 7,232,263 | B2 | | 6/2007 | Sashinaka et al. |
| 7,245,498 | B2 | * | 7/2007 | Togami et al. ................. 361/753 |
| 7,280,724 | B2 | * | 10/2007 | Yoshikawa ...................... 385/52 |
| 7,290,944 | B2 | * | 11/2007 | Ishigami et al. ................ 385/92 |
| 7,367,717 | B2 | * | 5/2008 | Yu et al. .......................... 385/90 |
| 2003/0113120 | A1 | * | 6/2003 | Ohe et al. ....................... 398/139 |
| 2004/0108593 | A1 | * | 6/2004 | Oda et al. ....................... 257/734 |

FOREIGN PATENT DOCUMENTS

| JP | 8-136767 A | 5/1996 |
|---|---|---|
| JP | 11-345987 A | 12/1999 |
| JP | 2001-298217 A | 10/2001 |
| JP | 2002-359426 A | 12/2002 |

* cited by examiner

*Primary Examiner* — Kambiz Zand
*Assistant Examiner* — Abiy Getachew
(74) *Attorney, Agent, or Firm* — Foley & Lardner LLP

(57) ABSTRACT

A transmission/reception optical module has an optical transmission subassembly 182, an optical reception subassembly 183, and a circuit board 1 wherein the circuit board 1 is formed into one member by a rigid/flexible substrate. Circuit board main bodies 2a, 2b, and an optical reception subassembly fixation region 4 are formed by rigid regions 5A, 5b, and 5P. An area provided between the circuit board main body 2a and the optical reception subassembly 4 is composed of a flexible region 6P. A part of the circuit board main body 2 is composed of a flexible region 6.

7 Claims, 23 Drawing Sheets

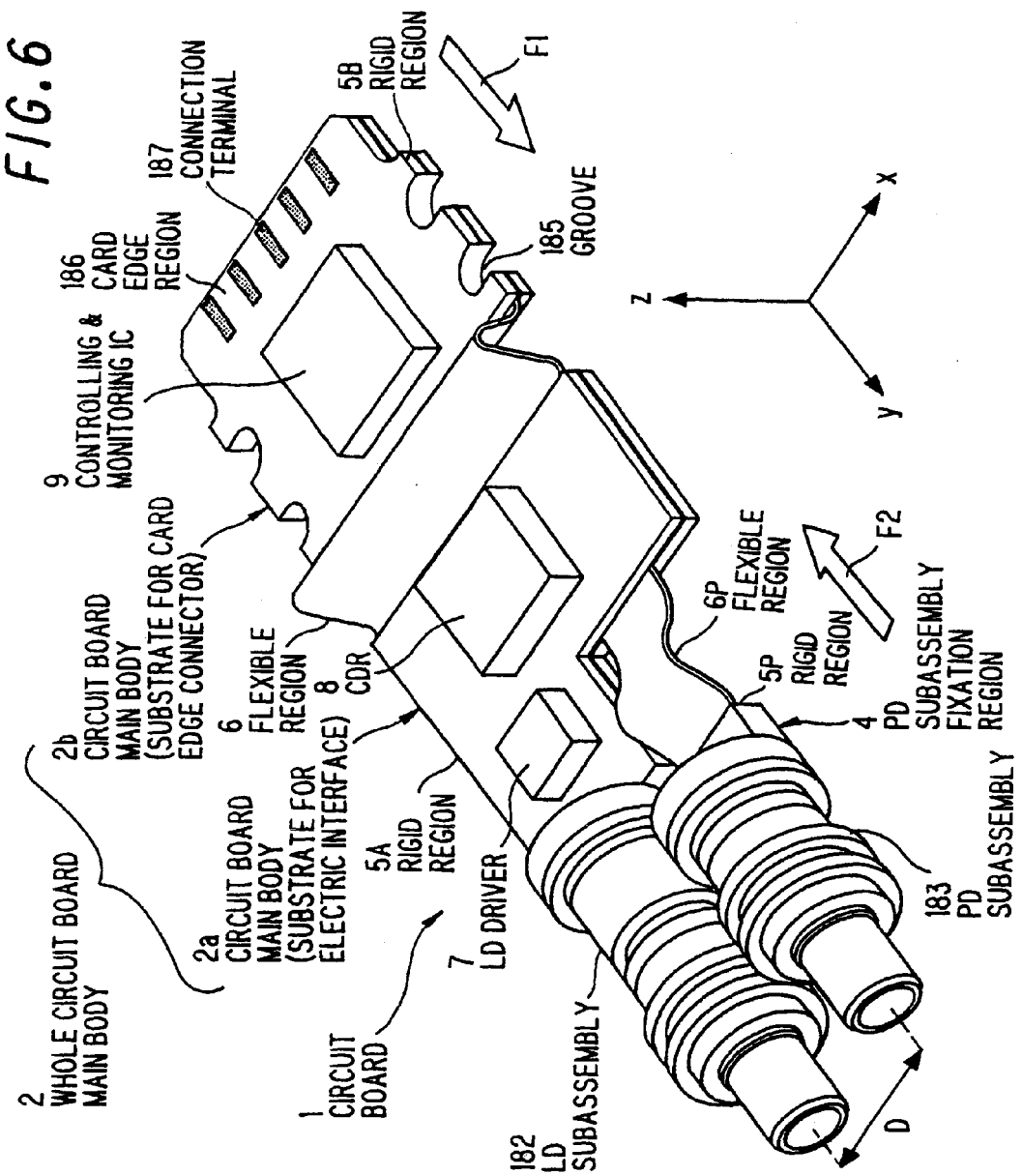

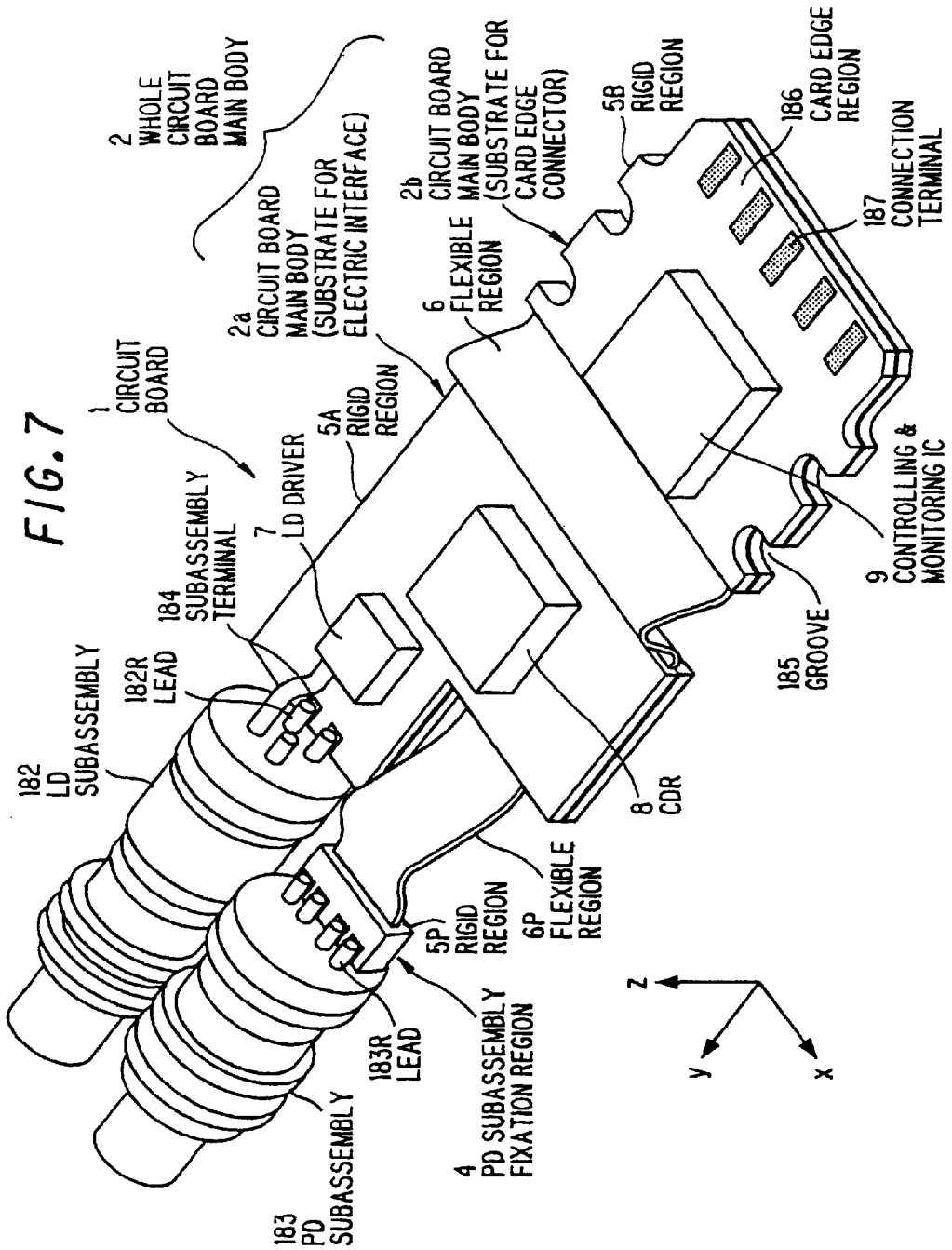

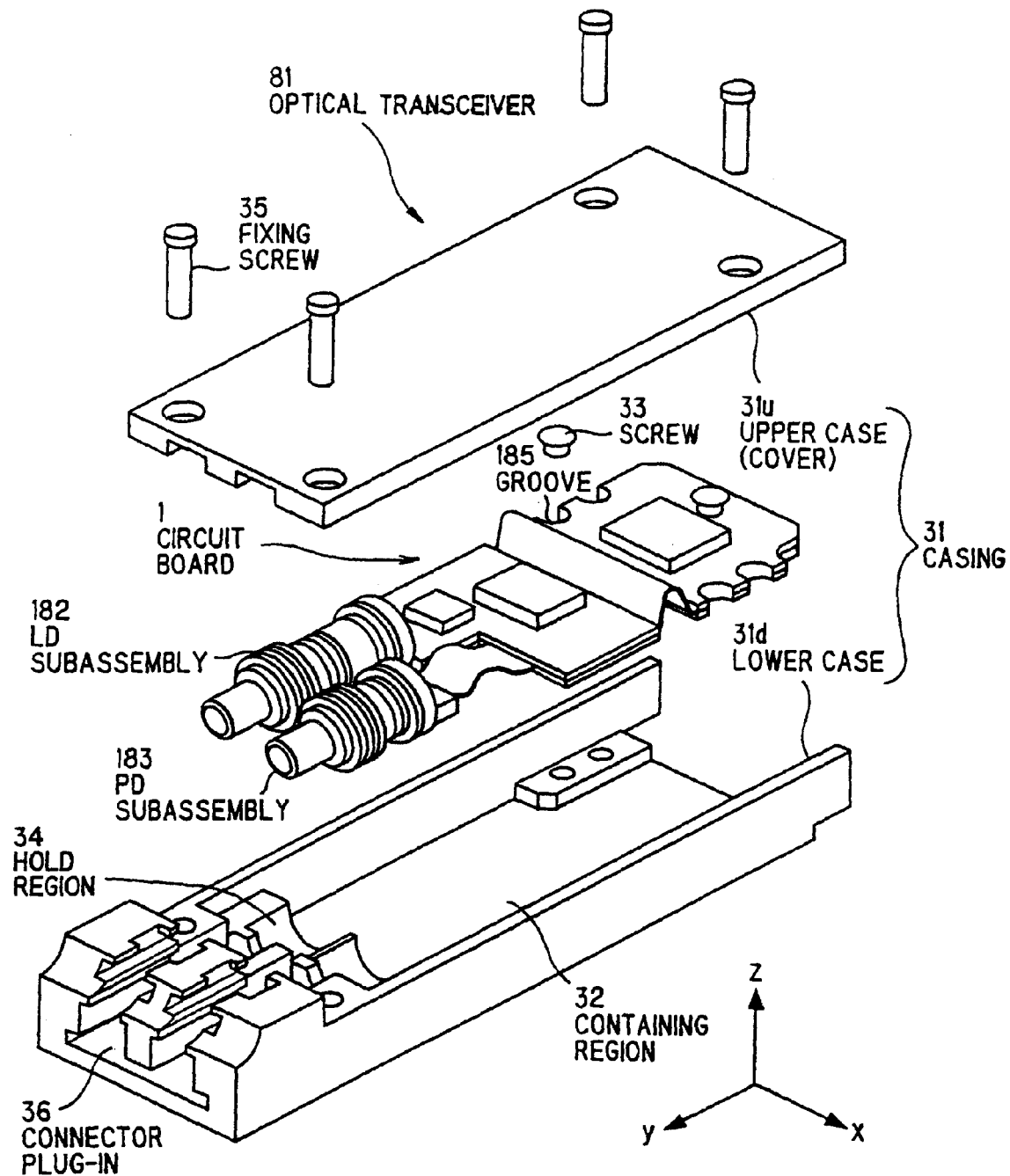

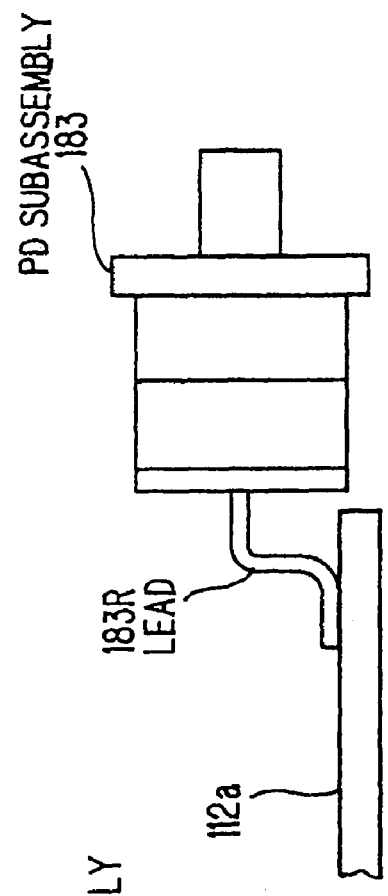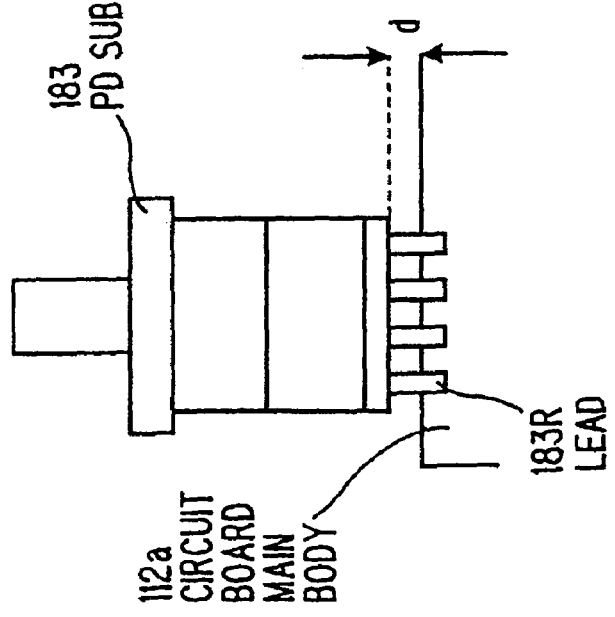

TRANSMISSION/RECEPTION OPTICAL MODULE

The present application is a divisional application of U.S. application Ser. No. 10/962,450, filed Oct. 13, 2004, which claims priority to Japanese patent application No. 2004-023846, the entire contents of which are incorporated herein by reference.

BACKGROUND OF THE INVENTION

1. Field of the Invention

The present invention relates to a transmission/reception optical module having an optical transmission subassembly, an optical reception subassembly, and a circuit board for controlling the optical transmission subassembly and the optical reception subassembly.

2. Description of the Related Art

A transmission/reception optical module (optical transceiver) is provided with, for example, a circuit board 181 as shown in FIG. 1 wherein the circuit board 181 is formed by a rigid substrate (a substrate which is not flexible, but rigid and not bent) which is formed entirely in the same plane. To one end of the circuit board 181, an LD (semiconductor laser) subassembly 182 and a PD (photodiode) subassembly 183 are fixed. Leads 182R of the LD subassembly 182 and leads 183R of the PD subassembly 183 situated, respectively, at an end of the LD subassembly 182 and an end of the PD subassembly 183 are soldered onto respective subassembly terminals 184 formed on the end of the circuit board 181 to be secured thereto.

The circuit board 181 is incorporated into a casing (not shown). Grooves 185, 185 for positioning screws are provided on opposed sides of the circuit board 181 in a side opposite to that where the LD and PD subassemblies are secured. The circuit board 181 is screwed to the casing so as to fix vertically the circuit board 181 (±z-direction in FIG. 1). A card edge region 186 for attaching the circuit board 181 to communication equipment (not shown) and detaching it from the latter (inserting the circuit board 181 into communication equipment (not shown) and extracting it from the latter) is formed on the other end of the circuit board 181 opposite to that where the LD and PD subassemblies are secured. Connection terminals 187, 187, . . . for connecting electrically the circuit board 181 to the communication equipment are formed in the card edge region 186.

When the card edge region 186 contained in the casing is inserted into the communication equipment along −y direction, the circuit board 181 is electrically connected with the communication equipment. On one hand, when optical connectors each containing an optical fiber functioning as a transmission line (not shown) are connected to each one end of the LD subassembly 182 and the PD subassembly 183, the transmission lines are connected optically to the LD subassembly 182 and the PD subassembly 183, respectively, and they are ready for use.

For the optical connection, each height (vertical position in optic axis, i.e. ±z-direction in FIG. 1) of the LD subassembly 182 and the PD subassembly 183, and a distance D (a distance between the optical axes, i.e. a width (±x) direction in FIG. 1) of the LD subassembly and the PD subassembly 183 are previously determined to have each predetermined dimension.

Information for literary documents of the prior art of the invention according to this application are as follows:

Japanese patent application laid-open Nos. 2001-298217 and 1996-136767

In these circumstances, however, it is difficult to assure the correct distance D which has been previously determined in case of securing the LD subassembly 182 and the PD subassembly 183 to the circuit board 181. Even if both the subassemblies 182 and 183 are secured to the circuit board 181 with the distance D, there is such a problem that a considerable stress s appears on the LD subassembly 182 and the PD subassembly 183 in the case where each height of the LD and PD subassemblies 182 and 183, and the distance D provided between them do not coincide with the previously determined values, respectively. This is because the circuit board 181 is made from a rigid substrate which is formed entirely in the same plane, so that the LD subassembly 182 and the PD subassembly 183 are not in just the right sizes in a hold region 192 of a casing 191 containing the circuit board 181, when the LD and PD subassemblies 182 and 183 are fitted in the hold region 192 to be securely maintained (not perfectly rigid) as shown in FIG. 2A.

Particularly, since the remarkable stress s concentrates in a connection region for the circuit board 181 and the LD and PD subassemblies 182, 183, cracks appear easily in the solder. Accordingly, transmission properties of the LD subassembly 182 and reception properties (e.g. reception sensitivity) of the PD subassembly 183 become inferior. Furthermore, there is a case where optic axis deviation appears on the LD subassembly 182 or the PD subassembly 183 due to the stress s.

Moreover, there is such a case where since a contour of the LD subassembly differs from that of the PD subassembly 183 as shown in FIG. 2B, positions of the leads 182R differ also from those of the leads 183R. These problems as mentioned above cannot be solved fundamentally in the circuit board 181 made entirely from a rigid substrate.

The LD subassembly 182 is composed of an LD device module 301 wherein an LD device being a light-emitting element is contained in a package and a ferrule block (capillary block) 302 which is to be secured to the LD device module 301 so as to align their central axes and to which the above-mentioned optical connector is connected.

However, due to a reason for totalizing precisions of a variety of parts and the like, a central axis of the LD device module 301 deviates from that of the capillary block 302, when the central axes of the LD device module 301 and the capillary block 302 are aligned in, for example, ±x-, z-directions, and the length (±y) direction. Moreover, since a length L of the subassembly 182 is different from that of another subassembly as shown in FIG. 4, there is an inequality in each individual of the LD subassembly 182 wherein the central axis thereof is aligned. In this respect, when the circuit board 181 shown in FIG. 1 is used, deviation in each individual of the LD subassemblies 182 cannot compensate to each other.

When the LD subassembly 182 is secured to the casing 191 (see FIG. 2A), the best situation is in such that the circuit board 181 and the leads 182R secured to the circuit board 181 are in parallel to the horizontal (±x, y) direction of the casing 191.

However, there are a case where the LD subassembly 182 is secured with respect to the horizontal direction of the casing 191 at a deviated angle θ together with the circuit board 181 as shown in FIG. 5B, and a case where only the LD assembly 182 is secured at a deviated angle θ due to positional deviation of the leads 182R. When the circuit board 181 as shown in FIG. 1 is used, a deviation derived from varying results in securing the LD subassembly 182 to the circuit board 181 cannot be responded.

The same problems arise also in the PD subassembly 183 as those described with respect to the LD subassembly 183 by referring to FIGS. 3, 4, 5A, and 5B.

On the other hand, the circuit board 181 shown in FIG. 1 involves such a problem that when a screw accompanies with a backlash in case of attaching the card edge region 186 to or detaching the card edge region 186 from communication equipment (not shown), significant force F1 in +y-direction and force F2 in −y-direction are applied to the circuit board 181. As a result, a stress is applied to a connection section of the LD subassembly 182 and the PD subassembly 183, so that cracks appear easily in a solder.

Meanwhile, a difference in diameters of the LD subassembly 182 and the PD subassembly 183, and a deviation in tolerance of parts can be overcome by bending (forming) properly leads 182R and 183R for the LD subassembly 182 and the PD subassembly 183 in a transmission/reception optical module containing the circuit board 181 shown in FIG. 1 in case of a low speed transmission of a 1 Gbit/s or less in a signal transmission rate.

It is required, however, to make a transmission distance from an end of the circuit board 181 to the LD subassembly 182 or the PD subassembly 183 to be the shortest for achieving a high speed transmission of 5 Gbit/s or more. Particularly, leads to be formed on a side of the LD subassembly cannot be adopted, because transmission properties become inferior.

Although the circuit board 181 may be prepared from a flexible substrate, since such flexible substrate exhibits "arcuation", so that a transmission distance becomes long, resulting in inferior transmission properties. Accordingly, it is impossible to achieve a high speed transmission at a rate of 5 Gbit/s or higher by adopting simply a flexible substrate.

SUMMARY OF THE INVENTION

Accordingly, it is an object of the present invention to solve the above-described problems and to provide a transmission/reception optical module by which a high speed transmission is achieved.

In order to achieve the above-described object, a transmission/reception optical module according to the invention comprises an optical transmission subassembly including a light-emitting element; an optical reception subassembly including a light-receiving element; and a circuit board for controlling the optical transmission subassembly and the optical reception subassembly; the circuit board, comprising a rigid region including a first fixation region, to which the optical transmission subassembly is fixed, and a second fixation region, to which the optical reception subassembly is fixed; and a flexible region connected with the rigid region, the flexible region being positioned between at least one of the first and second fixation regions and a remaining portion of the rigid region.

In the transmission/reception optical module according to the present invention, the rigid region is divided into first and second rigid regions which are connected through an additional flexible region, the first rigid region being positioned on a side of the first and second fixation regions, and the second rigid region being positioned on an opposite side thereof to have an edge region including connection terminals on an opposite side to the additional flexible region.

Furthermore, a transmission/reception optical module according to the invention comprises an optical transmission subassembly including a light-emitting element and a monitor light-receiving element for monitoring an optical output of the light-emitting element; an optical reception subassembly including a light-receiving element and a preamplifying element for amplifying an output of the light-receiving element; and a circuit board for controlling the optical transmission subassembly and the optical reception subassembly; the circuit board being formed into one member by a rigid-flexible substrate comprising rigid regions and flexible regions wherein a circuit board main body, an optical transmission subassembly fixation region and an optical reception subassembly fixation region are composed of the rigid regions; while the circuit board main body is connected to the optical transmission subassembly fixation region, or the optical reception subassembly fixation region by the flexible region, and a part of the circuit board main body is composed of the flexible region.

Moreover, a transmission/reception optical module according to the invention comprises an optical transmission subassembly including a light-emitting element and a monitor light-receiving element for monitoring an optical output of the light-emitting element; an optical reception subassembly including a light-receiving element and a preamplifying element for amplifying an output of the light-receiving element; and a circuit board for controlling the optical transmission subassembly and the optical reception subassembly; the circuit board being formed into one member by a rigid-flexible substrate consisting of rigid regions and flexible regions wherein a circuit board main body, an optical transmission subassembly fixation region, and an optical reception subassembly fixation region are composed of the rigid regions; while the circuit board main body is connected to the optical transmission subassembly fixation region, and the optical reception subassembly fixation region by the flexible regions, and a part of the circuit board main body is composed of the flexible region.

In the transmission/reception optical module according to the present invention, a driver for driving the optical transmission subassembly is mounted on the optical transmission subassembly fixation region; and a control circuit for controlling the optical transmission subassembly and the optical reception subassembly, and a waveform-shaping IC of a transmission/reception combination type for shaping a waveform of an electrical signal input to the optical transmission subassembly and a waveform of an electrical signal output from the optical reception subassembly are mounted on the circuit board main body.

In the transmission/reception optical module according to the present invention, a driver for driving the optical transmission subassembly, and a waveform-shaping IC for transmission purpose for shaping a waveform of an electrical signal input to the optical transmission subassembly are mounted on the optical transmission subassembly fixation region; and a control circuit for controlling the optical transmission subassembly and the optical reception subassembly, and a waveform-shaping IC for reception purpose for shaping a waveform of an electrical signal output from the optical reception subassembly are mounted on the circuit board main body.

Furthermore, a transmission/reception optical module according to the invention comprises an optical transmission subassembly including a light-emitting element and a monitor light-receiving element for monitoring an optical output of the light-emitting element; an optical reception subassembly including a light-receiving element and a preamplifying element for amplifying an output of the light-receiving element; and a circuit board for controlling the optical transmission subassembly and the optical reception subassembly, wherein a circuit board main body, and an optical transmission subassembly fixation region and an optical reception subassembly fixation region are composed of rigid substrates; and the circuit board main body is connected with the optical transmission subassembly fixation region or the optical reception subassembly fixation region through a flexible substrate.

Moreover, a transmission/reception optical module comprises an optical transmission subassembly including a light-emitting element and a monitor light-receiving element for monitoring an optical output of the light-emitting element; an optical reception subassembly including a light-receiving element and a preamplifying element for amplifying an output of the light-receiving element; and a circuit board for controlling the optical transmission subassembly and the optical reception subassembly, wherein a circuit board main body, an optical transmission subassembly fixation region, and an optical reception subassembly fixation region are composed of rigid substrates; and the circuit board main body is connected with the optical transmission subassembly fixation region and the optical reception subassembly fixation region through flexible substrates.

In the transmission/reception optical module according to the present invention, the circuit board is divided into two sections, and one section of the circuit board is connected with the other section of the circuit board through the flexible substrate.

In the transmission/reception optical module according to the present invention, a driver for driving the optical transmission subassembly is mounted on the optical transmission subassembly fixation region; and a control circuit for controlling the optical transmission subassembly and the optical reception subassembly, and a waveform-shaping IC of a transmission/reception combination type for shaping a waveform of an electrical signal input to the optical transmission subassembly and a waveform of an electrical signal output from the optical reception subassembly are mounted on the circuit board main body.

In the transmission/reception optical module according to the present invention, a driver for driving the optical transmission subassembly, and a waveform-shaping IC for transmission purpose for shaping a waveform of an electrical signal input to the optical transmission subassembly are mounted on the optical transmission subassembly fixation region; and a control circuit for controlling the optical transmission subassembly and the optical reception subassembly, and a waveform-shaping IC for reception purpose for shaping a waveform of an electrical signal output from the optical reception subassembly are mounted on the circuit board main body.

In the transmission/reception optical module according to the present invention, the optical transmission subassembly differs from the optical reception subassembly in positions of leads, and lengths of the subassemblies.

In the transmission/reception optical module according to the present invention, the optical transmission subassembly and the optical reception subassembly are fitted in and secured to a casing into which the circuit board is to be incorporated.

BRIEF DESCRIPTION OF THE DRAWINGS

The present invention will be explained in more detail in conjunction with appended drawings, wherein:

FIG. 6 is a perspective view showing a circuit board to be contained in a transmission/reception optical module of a preferred embodiment according to the present invention;

FIG. 7 is a perspective view showing the circuit board contained in the transmission/reception optical module of FIG. 6 viewed from the y-direction;

FIG. 8 is an exploded perspective view showing the circuit board of FIG. 6 contained in an optical transceiver;

FIG. 17A is a partial plan view showing the circuit board of FIG. 16;

FIG. 17B is a partial side view showing the circuit board of FIG. 16;

DESCRIPTION OF THE PREFERRED EMBODIMENTS

Figure 1:
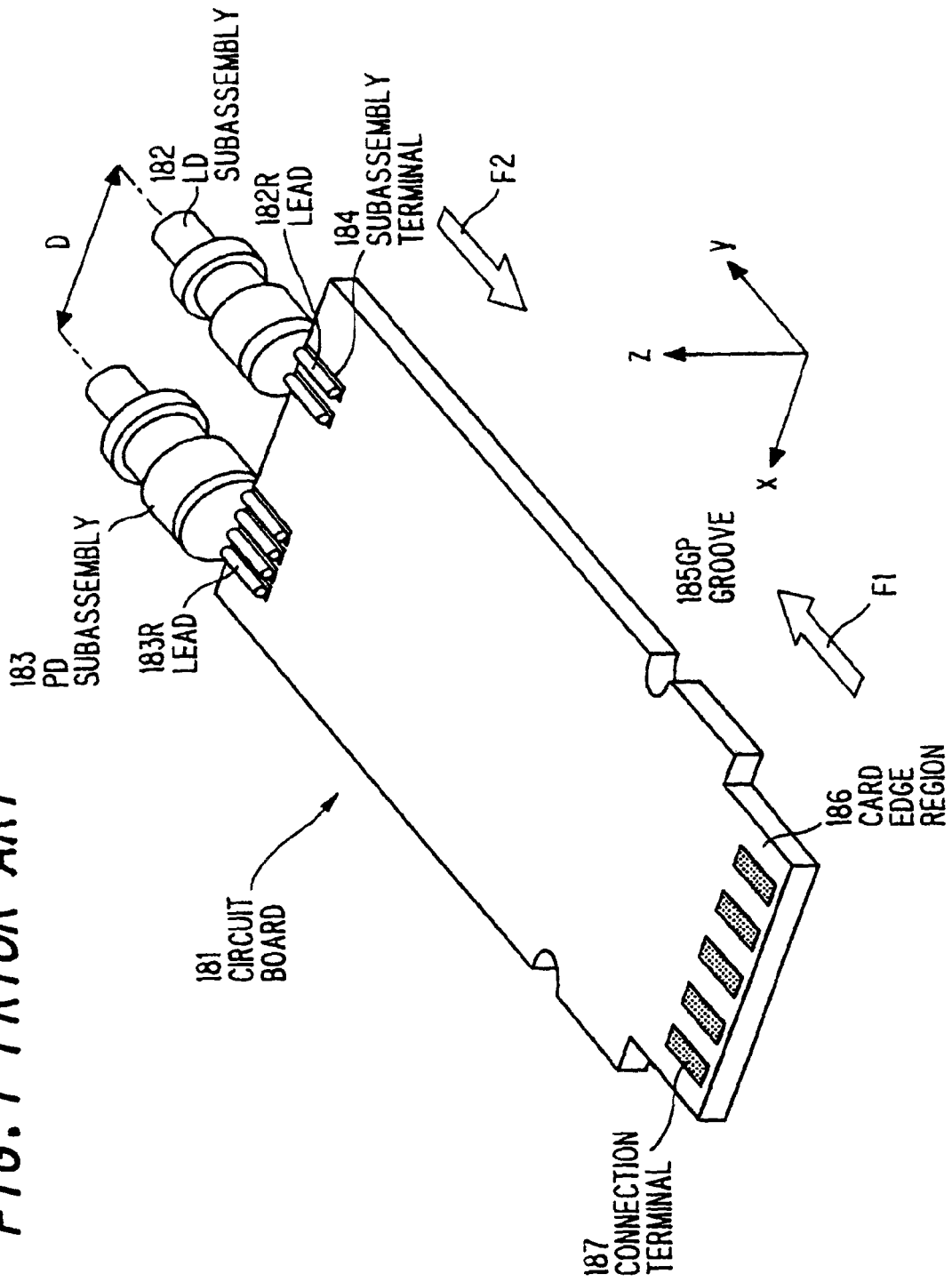
FIG. 1 is a perspective view showing a circuit board contained in a transmission/reception optical module of the background art.
Figure 2A:
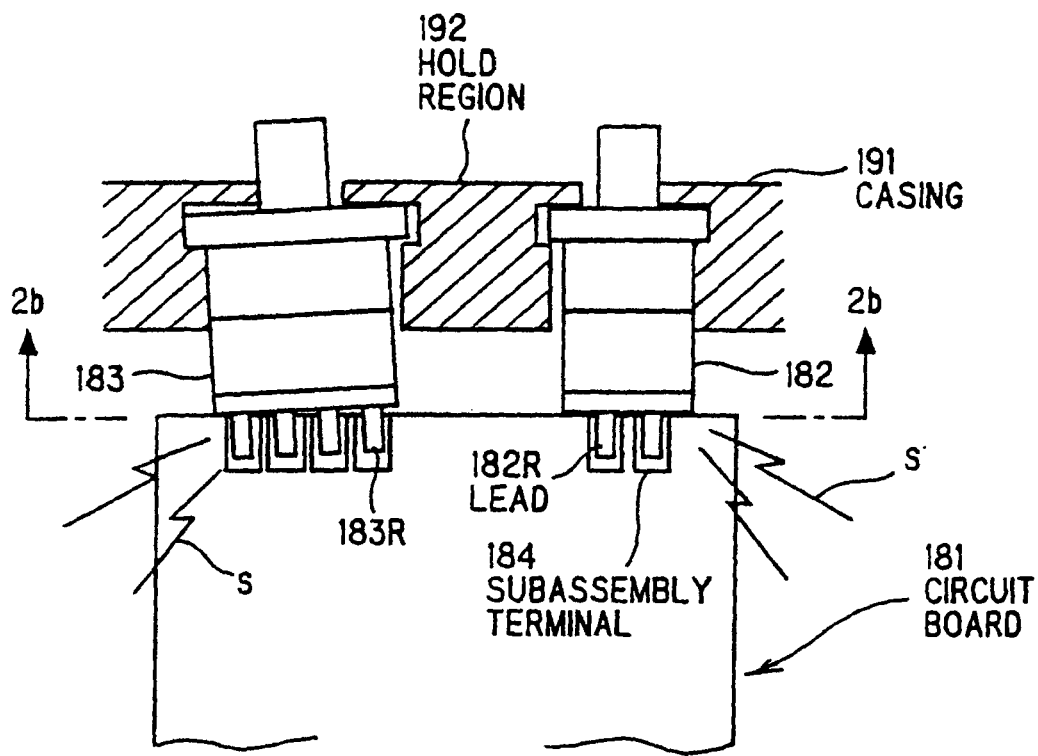
FIG. 2A is a plan view showing a condition of securing the circuit board shown in FIG. 1 to a casing.
Figure 2B:
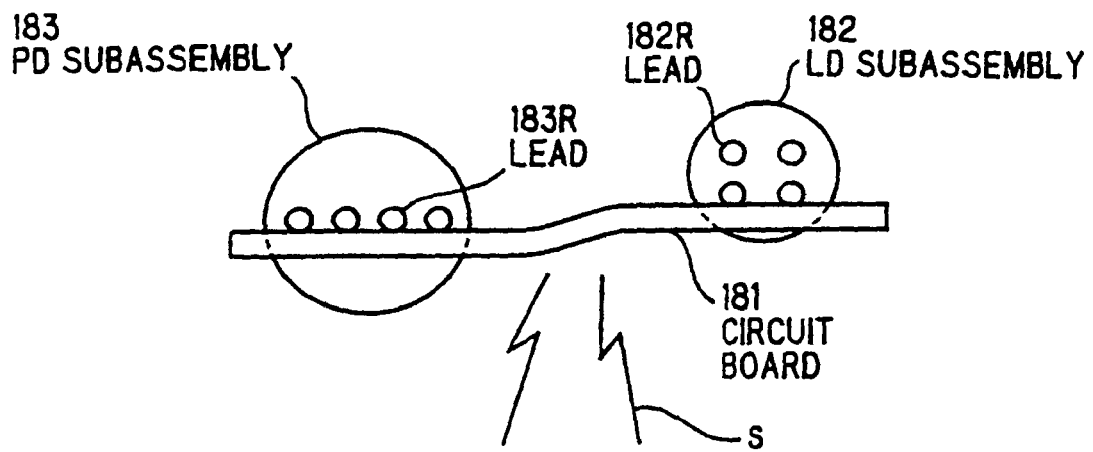
FIG. 2B is a sectional view taken in the direction of the arrows along the line 2b-2b of FIG. 2A
Figure 3:
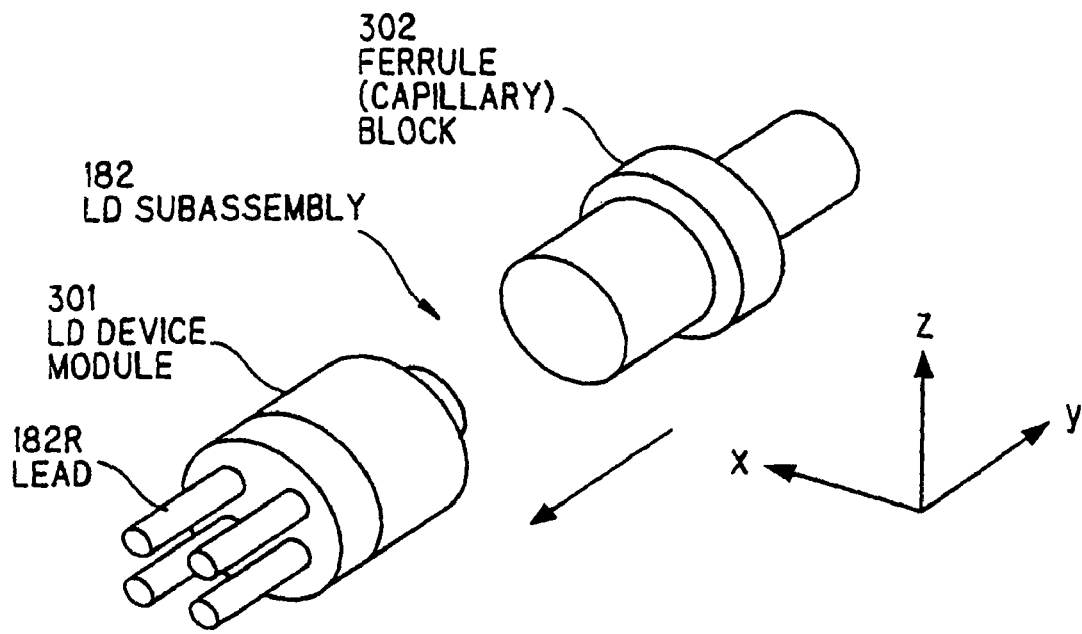
FIG. 3 is an exploded view showing an optical transmission subassembly.

Preferred embodiments of the present invention will be described in detail hereinafter by referring to the accompanying drawings.

FIG. 6 is a perspective view showing a circuit board to be contained in a transmission/reception optical module of a preferred embodiment according to the present invention, and FIG. 7 is a perspective view showing the circuit board contained in the transmission/reception optical module of FIG. 6 viewed from the y-direction. In the present embodiment, its width, length, and height directions of the circuit board correspond to x-, y-, and z-directions, respectively.

As shown in FIGS. 6 and 7, a circuit board 1 contained in a transmission/reception optical module of an embodiment according to the present invention is formed into one member by a rigid-flexible substrate (flex/rigid printed-wiring board) to keep a substantially horizontal state as a whole. The rigid-flexible substrate means a substrate wherein rigid regions and flexible regions are alternately placed along the longitudinal direction of the circuit board 1 so as to form one member.

The rigid region is prepared by laminating alternately a rigid substrate made from a usual glass epoxy material (rigid layer) and a flexible substrate (flexible layer) which is a rigid printed-wiring board withstanding a weight of parts to be loaded thereon and having a hardness and a strength sufficient for securing the rigid printed-wiring board to a casing made of a metal. The flexible region is composed of a flexible printed-wiring board having flexibility capable of being bent.

Incidentally, the circuit board 1 is composed of a circuit board main body 2a made of a rigid region 5A on a side, to which an LD subassembly 182, functioning as an optical transmission subassembly, and preferably comprising a light-emitting element (not shown) for emitting optical signals and a monitor light-receiving element (not shown) for monitoring an optical output of the light-emitting element, is attached (secured); a circuit board main body 2b made of a rigid region 5B on a side opposite to the circuit board main body 2a, the circuit board main body 2b being situated apart from the other end (the side opposite to the former side or the front end) of the circuit board main body 2a with a predetermined distance in the longitudinal direction of the circuit board 1 (−y direction in FIGS. 6 and 7); a PD subassembly fixation region 4 made of a rigid region 5P, to which a PD subassembly 183, functioning as an optical reception subassembly, and preferably comprising a light-receiving element (not shown) for receiving optical signals and a preamplifying element (not shown) for amplifying an output of the light-receiving element, is attached, the PD subassembly fixation region 4 being situated apart from an end (one side or the rear end) of the circuit board main body 2a with a predetermined distance in the longitudinal direction of the circuit board 1 (+y direction in FIGS. 6 and 7); a flexible region 6P for adjusting a variety of dispersions in the LD and PD subassemblies 182 and 183, the flexible region 6P being provided between the circuit board main body 2a and the PD subassembly fixation region 4; and a flexible region 6 for moderating forces (stresses) F1 and F2 which are applied to the circuit board 1, the LD subassembly 182, and the PD subassembly 183 in case of attaching them to or detaching them from communication equipment (not shown) and in case of attaching them to or detaching them from an optical connector (not shown).

In the circuit board 1, a part of a whole circuit board main body 2 is made from the flexible region 6. Namely, the whole circuit board main body 2 is composed of the circuit board main body (a substrate for an electrical interface) 2a, the circuit board main body (a substrate for a card edge connector) 2b, and the flexible region 6.

Figure 23:
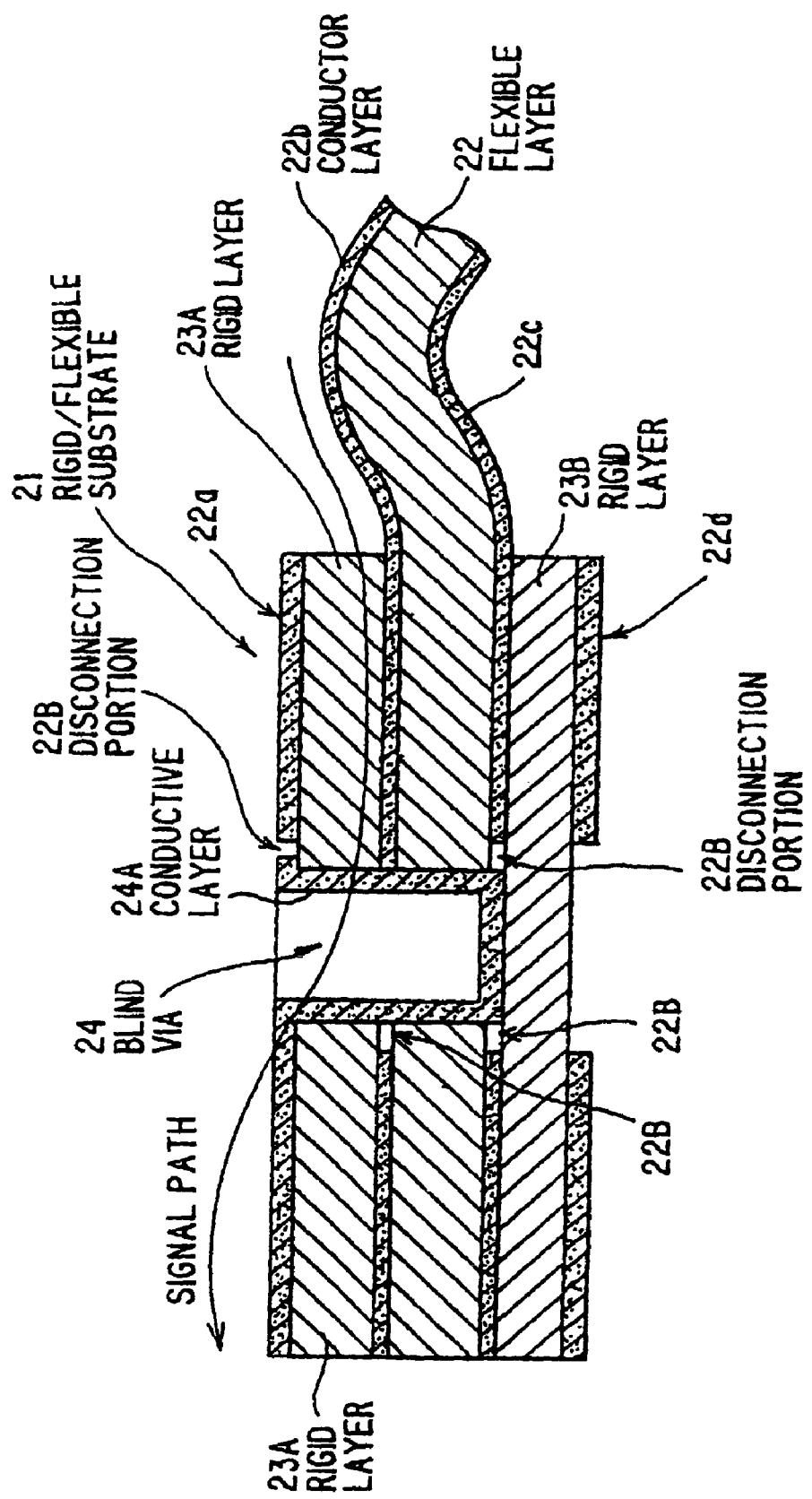
FIG. 23 is a longitudinal sectional view showing an example of a rigid/flexible substrate applied to the circuit board shown in FIG. 6.

In the present embodiment, as shown in FIG. 23, a rigid/flexible substrate 21 with less extra path (called "less stub") not needed essentially for signal paths is used as the circuit board 1. The rigid/flexible substrate 21 is composed of four conductor layers 22a to 22d, a rigid layer 23A sandwiched by the conductor layers 22a and 22b, a flexible layer 22 sandwiched by the conductor layers 22b and 22c, and a rigid layer 23B sandwiched by the conductor layers 22c and 22d. Further, the rigid/flexible substrate 21 has a blind via structure that a blind via 24 is formed to connect between the rigid layer 23A and the flexible layer 22 while not completely passing through the substrate 21. The flexible layer 22 with the conductor layers 22b and 22c is, as shown in FIG. 23, extended outside of the substrate 21 such that it composes the flexible region 6 or 6P mentioned earlier.

The conductor layer 22b is connected to the right side of the blind via 24 whereas the conductor layers 22a, 22c are at disconnection portions 22B disconnected from the blind via 24 and the conductor layer 22d is disconnected under the blind via 24. Further, the conductor layer 22a is connected to the left side of the blind via 24 whereas the conductor layers 22b, 22c are at disconnection portions 22B disconnected from the blind via 24. Thus, the flexible connection can be formed between the substrate 21 and the outside flexible layer 22, which corresponds to the flexible region 6 or 6P.

A signal path as indicated by an arrow in FIG. 23 is formed from the conductor layer 22b on the outside flexible layer 22 through the blind via 24 to the conductor layer 22a on the left side of blind via 24.

By being thus composed, disturbance in impedance on the signal transmission path can be suppressed and deterioration in signal waveform can be thereby reduced. Therefore, it is preferable that the rigid/flexible substrate 21 with the blind via structure is used to achieve a high transmission rate of 5 Gbit/s or higher.

Figure 24:
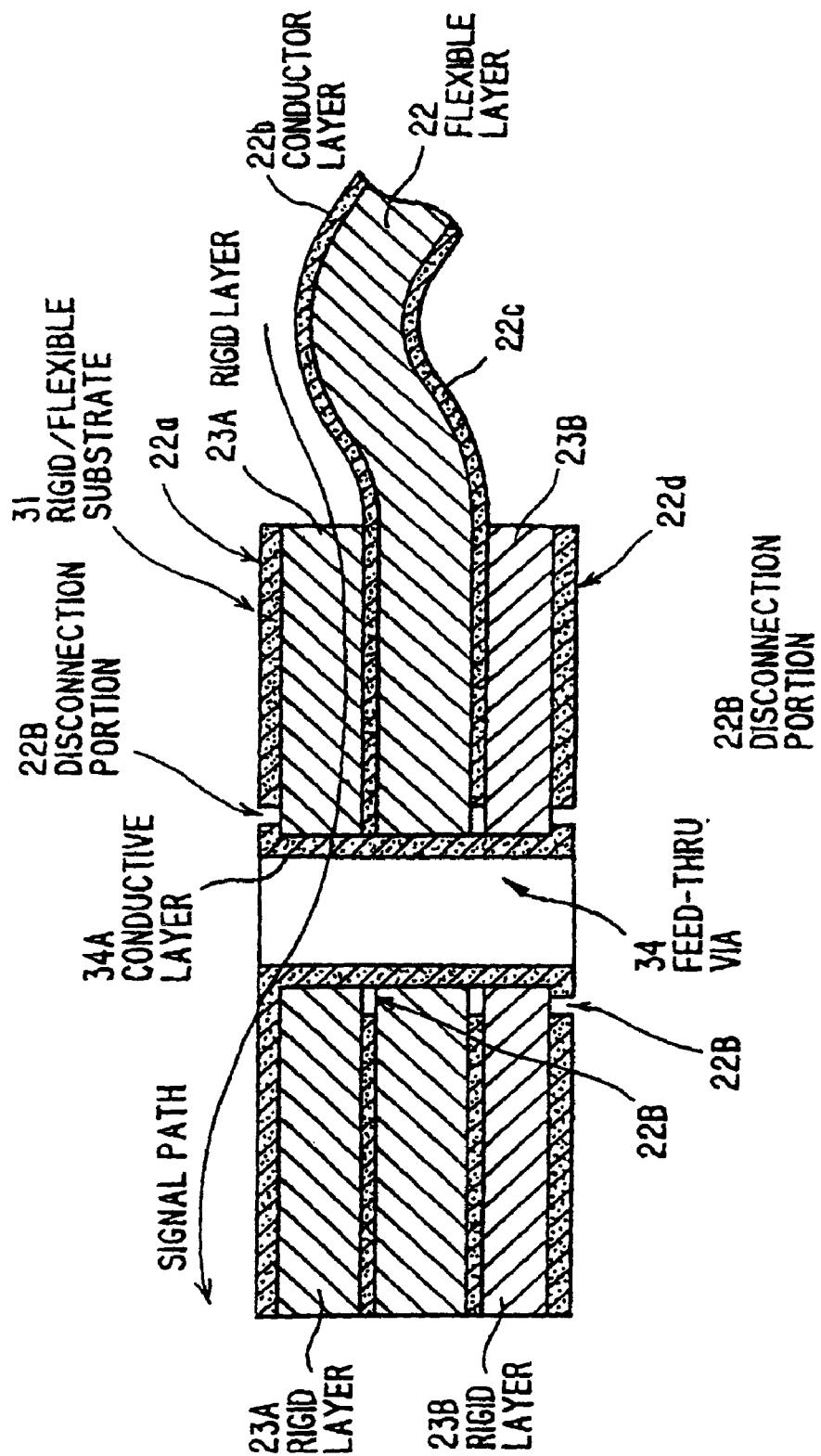
FIG. 24 is a longitudinal sectional view showing another example of a rigid/flexible substrate applied to the circuit board shown in FIG. 6.

Alternatively, in case of a transmission rate of about 1 to 5 Gbit/s, a rigid/flexible substrate 31 may be used that, as shown in FIG. 24, has a feed-thru via structure with a feed-thru via 34 passing through the substrate 31 while connecting the rigid layer 23A through the flexible layer 22 to the rigid layer 23B, or a stub structure. Like the rigid/flexible substrate 21 in FIG. 23, the flexible connection can be formed between the substrate 31 and the outside flexible layer 22, which corresponds to the flexible region 6 or 6P. Also, a signal path as indicated by an arrow in FIG. 24 is formed from the conductor layer 22b on the outside flexible layer 22 through the feed-thru via 34 to the conductor layer 22a on the left side of feed-thru via 34.

Returning to FIGS. 6 and 7, although it is not shown in detail, wiring patterns and terminals are formed on surfaces and/or reverse faces of the circuit board main bodies 2a, 2b, and the PD subassembly fixation region 4, and thereafter, a variety of electronic parts are mounted.

The circuit board main body 2a is shaped into a reverse L-shape one end of which is extended in the longitudinal direction of the circuit board 1. The LD subassembly 182 is secured to an end of the extended part of the circuit board main body 2a. Accordingly, the circuit board main body 2a corresponds to a member of an optical transmission subassembly fixation region made of the rigid region 5A formed into one piece, so that it is served also for the optical transmission subassembly fixation region.

The respective leads 182R disposed on an end of the LD subassembly 182 opposed to an end of the circuit board main body 2a (above and below two each leads, i.e. total four leads in FIG. 7) are soldered to be connected to the respective subassembly terminals 184 formed on the end of the circuit board main body 2a, whereby the leads are secured. More specifically, two leads on the under side are secured so as to be parallel to the surface of the circuit board main body 2a, and then, either of the leads 182R on the upper side is properly bent (formed) to be secured, while the other lead on the upper side is opened.

In this case, either of the leads 182R on the under side among four leads 182R is a line for high frequency signals, so that it cannot be formed. This is because a transmission distance between an end of the circuit board 1 and the LD subassembly 182 becomes long, so that signals are deteriorated, when either of the leads 182R on the under side is formed. Thus, a lead which may be formed is only either of the leads 182R on the upper side being a lead for a monitor PD.

Each lead 182R for the LD subassembly 182 and each lead 183R for the PD subassembly 183 are prepared from kovar or an iron-based material of 0.5 mm or less diameter.

High-frequency parts such as an LD driver 7 for driving an LD device contained in the LD subassembly 182, and a waveform shaping IC (CDR: Clock & Data Recovery) 8 of a transmission/reception combination type for shaping waveforms of electrical signals input to the LD subassembly and waveforms of electrical signals output from the PD subassembly 183 are mounted on the circuit board main body 2a.

For realizing a transmission/reception optical module of a signal transmission rate of higher than 5 Gbit/s, particularly, it is desirable that the LD driver 7 is mounted on the extended region of the circuit board main body 2a (at the vicinity of the LD subassembly 182), and further the CDR 8 is mounted on a side of the LD driver 7 wherein the side corresponds to the other side of that opposed to the LD subassembly 182. The reason why the high-frequency parts are mounted on the circuit board main body 2a resides in that the LD device cannot be operated at a high rate unless the high-frequency parts are mounted at the vicinity of the LD subassembly 182.

A controlling & monitoring IC 9 is mounted on the circuit board main body 2b, the controlling & monitoring IC 9 being served for a control circuit for controlling the LD subassembly 182 and the PD subassembly 183. The controlling & monitoring IC 9 may be mounted on the circuit board main body 2a. The controlling & monitoring IC 9 will be explained in FIG. 13 which is to be mentioned later.

The circuit board 1 is incorporated into a casing (see FIG. 8 which will be described hereunder) to be contained therein, and the circuit board 1 contained in the casing is used for an optical transceiver attached detachably to communication equipment such as a switching hub, and a media converter.

To secure the circuit board 1 to the casing, positioning grooves 185 are formed on opposite ends of the circuit board main body 2b, which extend across the circuit board main body 2b, for screwing the circuit board 1 to the casing in the vertical direction (±z direction in FIG. 6). A card edge region 186 is formed on the extreme end of the circuit board main body 2b for detachably attaching it to (inserting it into and extracting it from) an electric connector (card edge connector) contained in communication equipment (not shown), and the connection terminals 187 for connecting electrically the circuit board 1 with the communication equipment are formed on the card edge region 186.

The PD subassembly 183 is secured to an end of the PD subassembly fixation region 4. The leads 183R (four leads aligned in parallel to each other in FIG. 7) disposed on an end of the PD subassembly 183 are soldered to the respective subassembly terminals 184 formed on the end of the PD subassembly fixation region 4 to connect the leads 183R to the subassembly terminals 184 to fix them, respectively.

A variety of deviations in the LD and PD subassemblies 182 and 183 means deviations in the respective LD subassemblies or the respective PD subassemblies among their manufactured goods, and a deviation between the LD subassembly 182 and the PD subassembly 183 secured to the same circuit board 1.

Figure 4:
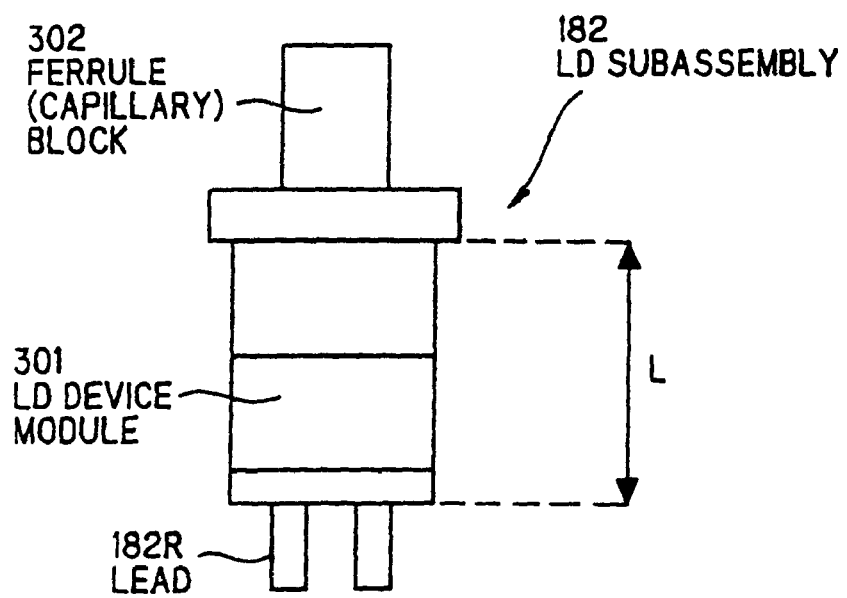
FIG. 4 is a plan view showing the optical transmission subassembly.
Figure 5A:
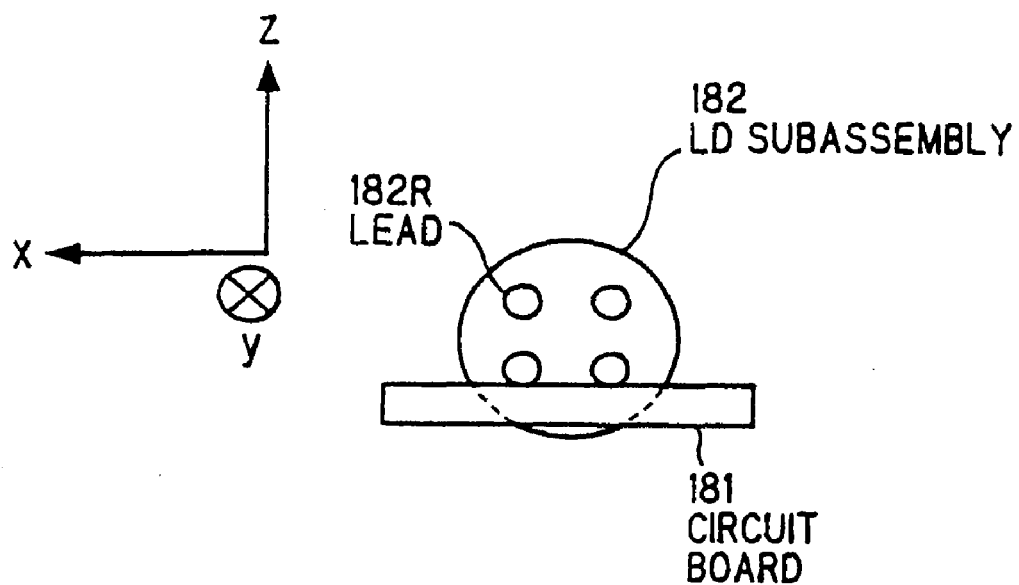
FIG. 5A is a bottom view of the optical transmission subassembly secured to a casing in the best condition.
Figure 5B:
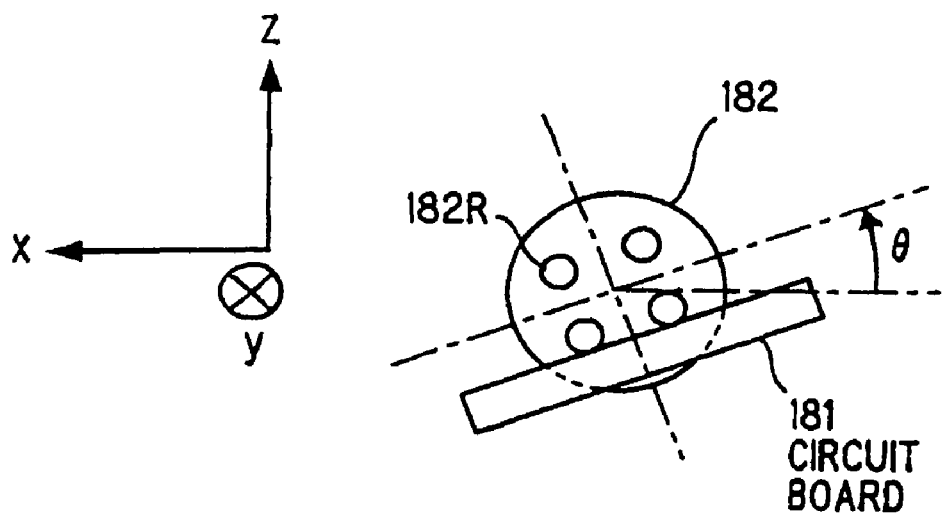
FIG. 5B is a bottom view of the optical transmission subassembly secured in a deviated condition at an angle with respect to the casing.

More specifically, they are a deviation derived from different positions of the leads 182R and 183R, because the LD subassembly 182 has usually a different contour from that of the PD subassembly 183 as mentioned above; a deviation in each individual wherein central axes of the LD subassembly 182 and/or the PD subassembly 183 are aligned, respectively, which is derived from a different subassembly length L in the LD and PD subassemblies 182 and 183 after the central axes of them were aligned as described in FIG. 4; and a deviation due to a different secured condition of the LD subassembly 182 and/or the PD subassembly 183 as shown in FIG. 5B.

In the present embodiment, to moderate efficiently a force F2 which is applied to the circuit board 1 at the time when an optical connector is attached or detached, widths of the circuit board main bodies 2a, 2b, and a width of the flexible region 6 are made to be equal to each other. Moreover, the flexible region 6 is adapted to form an "arcuation", when the circuit board 1 is contained in a casing.

Figure 13:
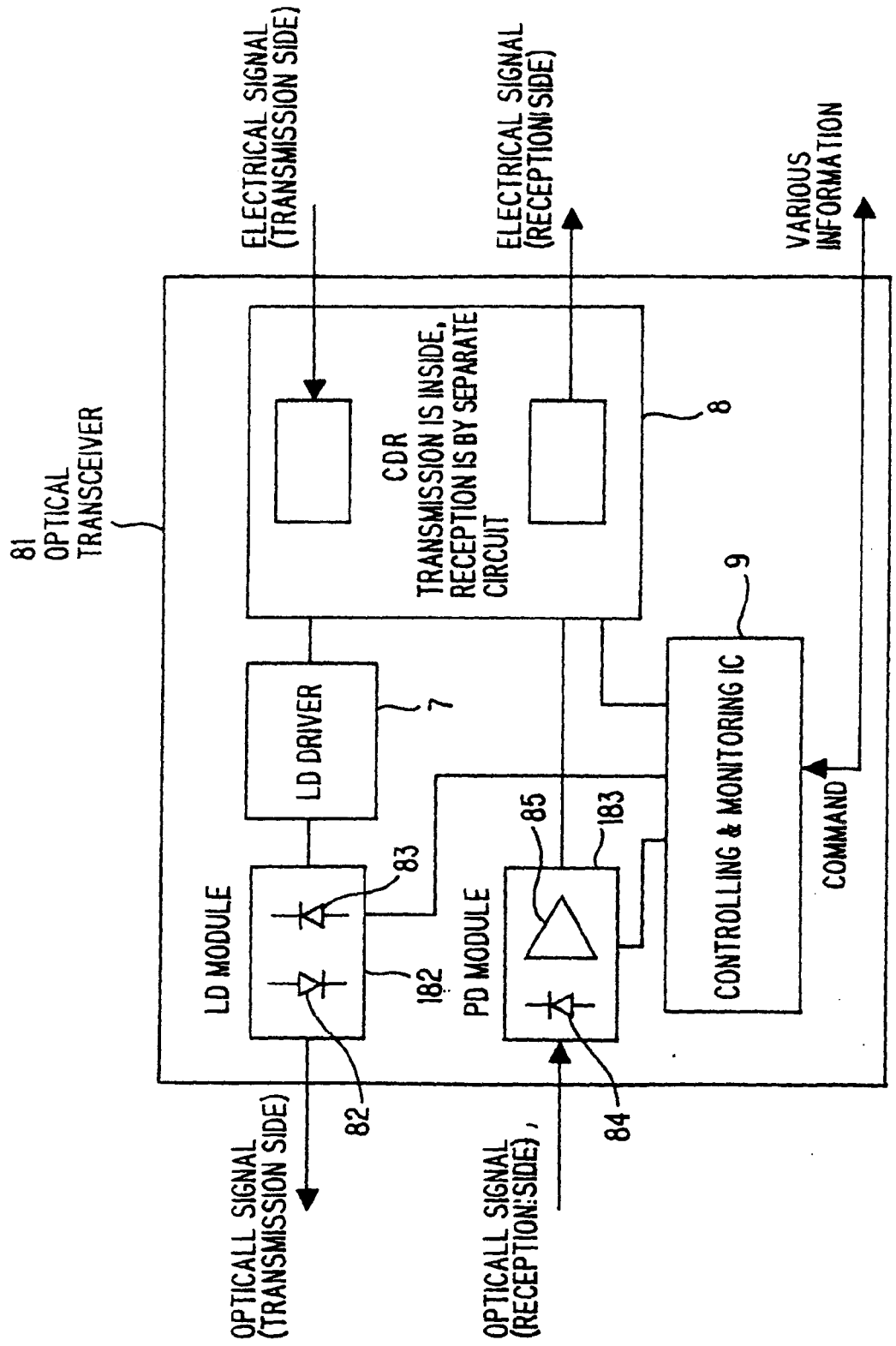
FIG. 13 is a circuit diagram showing an optical transceiver containing the circuit board of FIG. 6.

An example of a circuit constitution of a transmission/reception optical module (optical transceiver) containing the circuit board 1 is described by referring to FIG. 13 wherein the right side corresponds to an external (communication equipment) side, while the left side corresponds to a side of transmission path.

As shown in FIG. 13, an optical transceiver 81 according to the present embodiment is constituted by an LD subassembly 182, an LD driver 7 to be connected to the preceding stage of the LD subassembly 182, a PD subassembly 183, a CDR 8 to be connected to the preceding stage of the LD subassembly 182 and the subsequent stage of the PD subassembly 183, and a controlling & monitoring IC 9 connected to the LD subassembly 182, the PD subassembly 183, and the CDR 8, respectively.

The LD subassembly 182 consists essentially of an LD device 82 functioning as a light-emitting element, and a monitor PD 83 for monitoring rearward light (optical output). The PD subassembly 183 consists essentially of a PD device 84 functioning as a light-receiving element, and a preamplifier for amplifying an output of the PD device 84. The CDR 8 contains a circuit on the transmission side and a circuit on the reception side which are separately constituted inside thereof.

The controlling & monitoring IC 9 receives commands (those of ON/OFF for the LD device 82, and power down for the LD device 82) to control the optical transceiver 81, and transmits a variety of information (a power monitor information of the LD device 82, light reception monitor and temperature information of the PD device 84, a power consumption and self check information in case of troubles of the LD device 82, and the like information) to communication equipment.

As shown in FIG. 8, the circuit board 1 to which the LD subassembly 182 and the PD subassembly 183 are attached is incorporated in a casing consisting of a lower case 31d and an upper case (cover) 31u to be contained therein. The lower case 31d and the upper case 31u are formed in a lump by means of die casting from a metal such as Zn and Al exhibiting high heat liberation.

Figure 9:
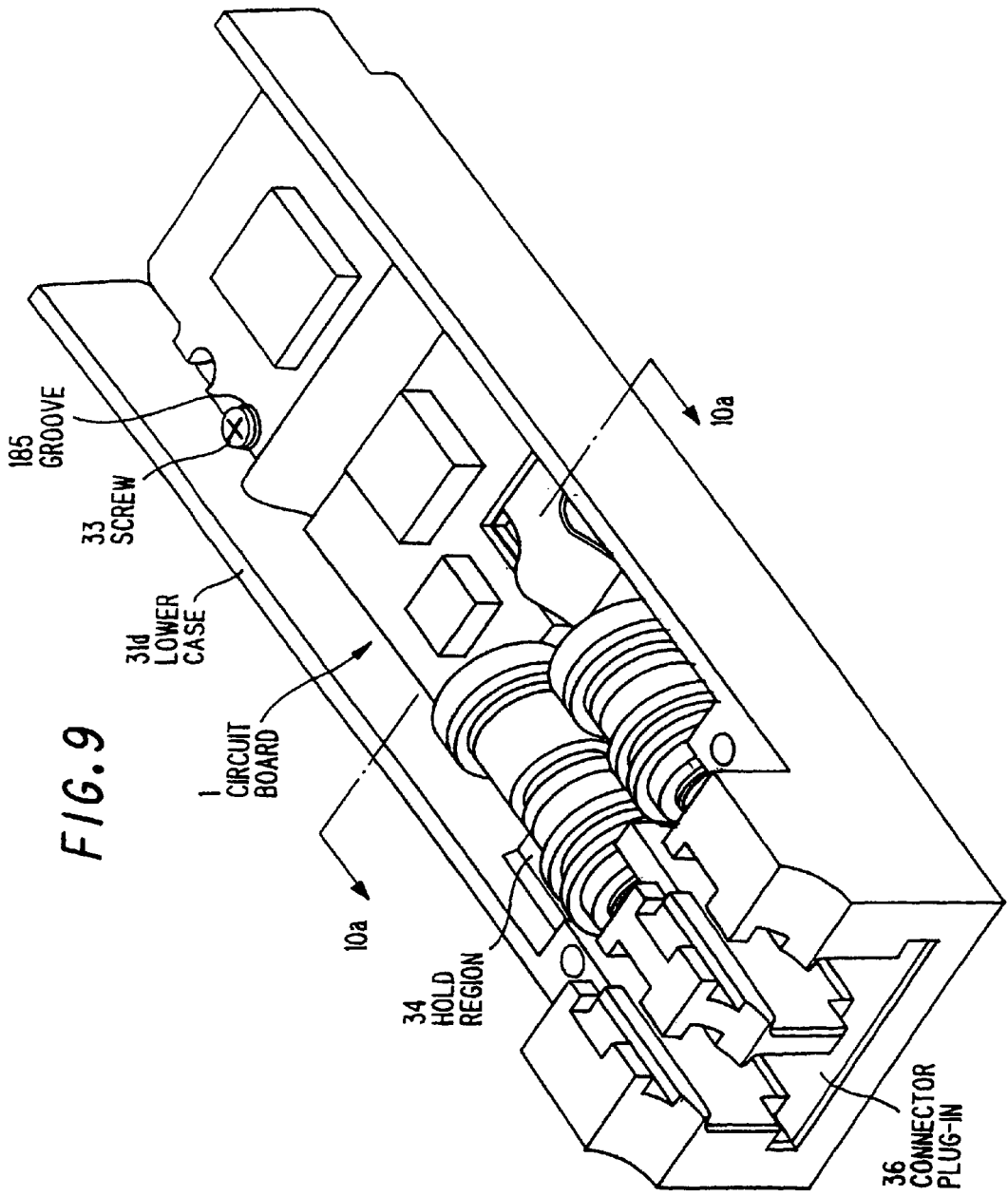
FIG. 9 is a perspective view showing a condition wherein the circuit board of FIG. 6 is secured to a lower case.

In more detail, the circuit board 1 is first incorporated in a containing region 32 of the lower case 31d while positioning grooves 185 to the lower case 31d, and then, the circuit board 1 is secured by two screws 33 for securing a circuit board to the lower case 31d. The LD subassembly 182 is fitted in a hold region 34 of the lower case 31d to hold and secure the LD subassembly 182 (not completely rigid), and the flexible region 6P is appropriately moved in the width, length, and vertical directions so as the LD subassembly 182 to be suitably fitted in the hold region 34, whereby the LD subassembly 182 is held and secured. As a result, the circuit board 1 is in a condition shown in FIG. 9.

Thereafter, the lower case 31d is covered with the upper case 31u, and the upper case 31u is fixed to the lower case 31d by two fixing screws 35, whereby the circuit board 1 is contained in the casing 31.

When the card edge region 186 is inserted in communication equipment together with the casing 31 along −y direction, the circuit board 1 contained in the casing 31 is connected electrically with the communication equipment. Furthermore, when an optical connector containing an optical fiber (not shown) being a transmission path is inserted in a connector plug-in 36 of the lower case 31d so that the optical connector is connected to one end of the LD subassembly 182 and one end of the PD subassembly 183, respectively, the LD subassembly 182 and the PD subassembly 183 are coupled optically to the optical transmission paths, respectively. As a result, the circuit board 1 may be used as the optical transceiver 81.

Operations of the present embodiment will be described hereunder.

Since either side of the circuit board 1 is composed of a flexible structure, in other words, since the circuit board main body 2a is connected with the PD subassembly fixation region 4 through the flexible region 6P, a dispersion can be absorbed by the flexible region 6P to adjust the dispersion. More specifically, a dispersion derived from differences between positions of the leads 182R in the LD subassembly 182 and those of the 183R in the PD subassembly 183 can be adjusted by moving the PD subassembly fixation region 4 in the vertical direction (±z directions in FIG. 6), when the circuit board 1 is incorporated into the casing 31 (see FIG. 8) because of flexibility of the flexible region 6.

In FIGS. 6 and 7, although an example wherein the flexible region 6P is applied on the side of the PD subassembly 183 is described, the same functions and advantageous effects can be obtained in the case where the flexible region is applied to the side of the LD subassembly 182.

Moreover, when the PD subassembly fixation region 4 is moved in the length direction thereof (±y directions in FIG. 6), a dispersion due to different lengths L of subassemblies after the central axes thereof were aligned in an individual each of the LD subassembly 182 and/or the PD subassembly 183 is absorbed by the PD subassembly fixation region 4, so that the dispersion can be adjusted.

Furthermore, when the PD subassembly fixation region 4 is somewhat rotated around the optic axis, a dispersion due to a difference in secured conditions of the LD subassembly 182 and/or the PD subassembly 183 is absorbed by the flexible region 6P, so that the dispersion can be adjusted.

Figure 10:
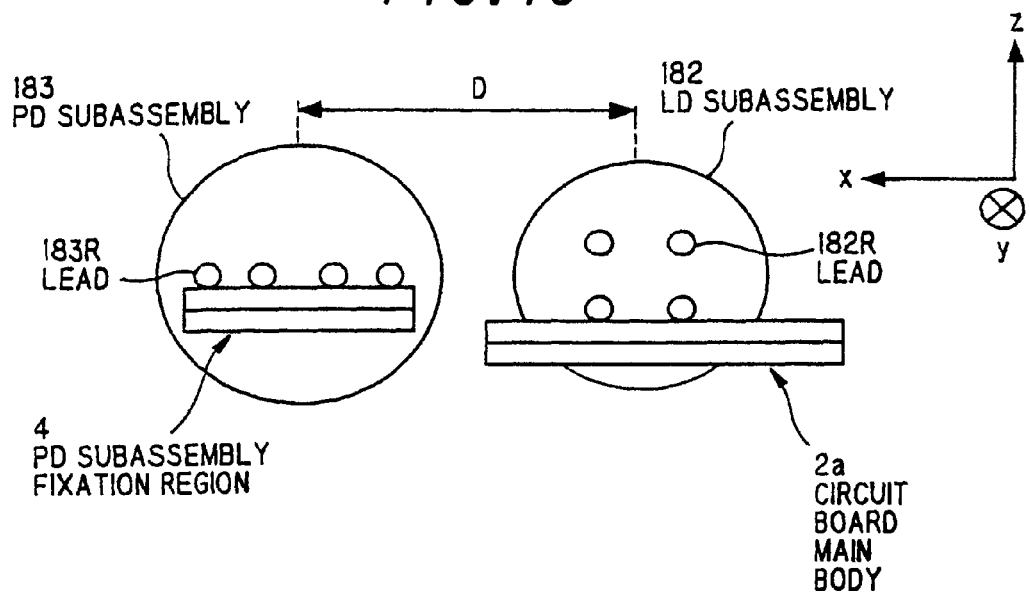
FIG. 10 is a sectional view taken in the direction of the arrows along the line 10a-10a of FIG. 9.
Figure 11:
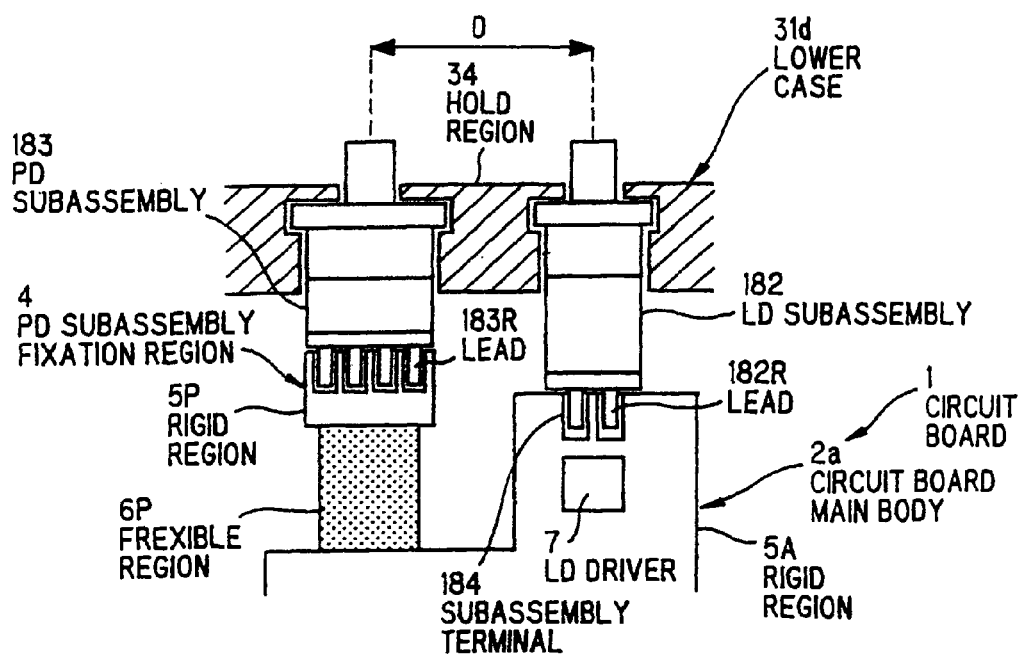
FIG. 11 is a partial plan view of FIG. 9.

Hence, as shown in FIGS. 10 and 11, heights of the LD subassembly 182 and the PD subassembly 183, and a distance D provided between the LD subassembly 182 and the PD subassembly 183 can be positively conformed to predetermined dimensions in the case when the LD subassembly 182 and the PD subassembly 183 are held in and secured to the hold region 34 inside the casing 31 into which the circuit board 1 is incorporated. As a result, no stress appears in the LD subassembly 182 and the PD subassembly 183. Particularly, since a stress is not concentrated in a connection region of the LD subassembly 182 or the PD subassembly 183, no crack appears in a soldered region.

According to the present embodiment of the invention, the circuit board 1 can be incorporated in the casing 31 without producing a stress in the LD subassembly 182 and the PD subassembly 183, and further with canceling a variety of dispersions in respective LD subassemblies and respective PD subassemblies.

As described above, according to the optical transceiver 81 containing the circuit board 1, a variety of deviances, dispersions, and stresses due to the dispersions can be absorbed by the flexible region 6P or the flexible region 6, besides, it becomes possible to respond to a great variety of LD subassemblies 182 and PD subassemblies 183.

Accordingly, there is no such occasion that transmission properties of the LD subassembly 182 and reception properties (e.g. receiver sensitivity) of the PD subassembly 183 deteriorate, and an optic axis deviation appears in the LD subassembly 182 and the PD subassembly 183.

In addition, since the circuit board 1 is formed into one member by a rigid/flexible substrate, the circuit board main body 2a may be electrically connected with the PD subassembly fixation region 4 to constitute the circuit board 1 without using any solder on the opposite ends of the flexible region 6P.

When a screw has any looseness and the like, large forces F1 in +y direction and F2 in −y direction are applied to the circuit board 1 in case of attaching or detaching the card edge region 186 to or from an electrical connector contained in communication equipment (not shown). In this respect, however, the forces (movement of the circuit board 1) F1 and F2 are absorbed by the flexible regions 6 and 6P according to the present embodiment, such forces (stresses) to be applied to the circuit board 1, the LD subassembly 182, and the PD subassembly 183 can be moderated in case of attaching and detaching the card edge region 186. Likewise, since movements of the LD subassembly 182 and the PD subassembly 183 are absorbed by the flexible regions 6 and 6P, stresses arising in case of attaching and detaching an optical connector to and from the circuit board 1 can be also moderated.

As mentioned above, the circuit board 1 is formed by the use of the flexible regions 6 and 6P, and the transmission/reception optical module 81 containing the circuit board 1 is constituted in accordance with the present embodiment. As a result, differences in diameters, distortions due to dispersions in tolerance of parts dimensions and the like of the LD subassembly 182 and the PD subassembly 183 can be prevented.

However, when signals are transmitted at a signal transmission rate of 1 Gbit/s or higher, and particularly at a high signal transmission rate of 5 Gbit/s or higher, deterioration of signals appears due to "arcuation" of the flexible regions 6 and 6P, so that high speed transmission becomes impossible.

To solve the problem as described above, an LD driver 7 and a CDR 8 are mounted on the circuit board main body 2a. The reason for such arrangement will be described hereinafter.

Transmission Side:

A high speed electrical signal is input to the circuit board main body 2b from the outside (communication equipment) through the card edge region 186. Then, the electrical signal passes through the flexible region 6, and inputs to the CDR 8. The CDR 8 shapes a deteriorated electrical waveform, and the corrected electrical signal is amplified in the LD driver 7 to drive an LD device, so that the electrical signal is converted to an optical signal.

In this case, a place where transmission properties of the optical transceiver 81 are affected severely is a circuit constitution area provided between the CDR 8 and the LD device. It is preferred to make its circuit length the shortest, and it is undesirable to appear a deviance of impedance in the area. For instance, when a flexible region exists between the CDR 8 and the LD device, an "arcuation" must be disposed in the flexible region, so that its circuit length becomes longer than a distance in a straight line because of the arcuation. Furthermore, since the flexible region positions in substrate layers (in between rigid regions), a signal must be transmitted to the flexible region of an inner layer from the surface layer through a via. However, since the via has a three-dimensional structure, it is difficult to match impedances, so that a signal is deteriorated in the via. Due to the reason as described above, it is desirable that the flexible region 6 is placed to rearward from the CDR 8 (on the side of the card edge region 186).

Figure 25A:
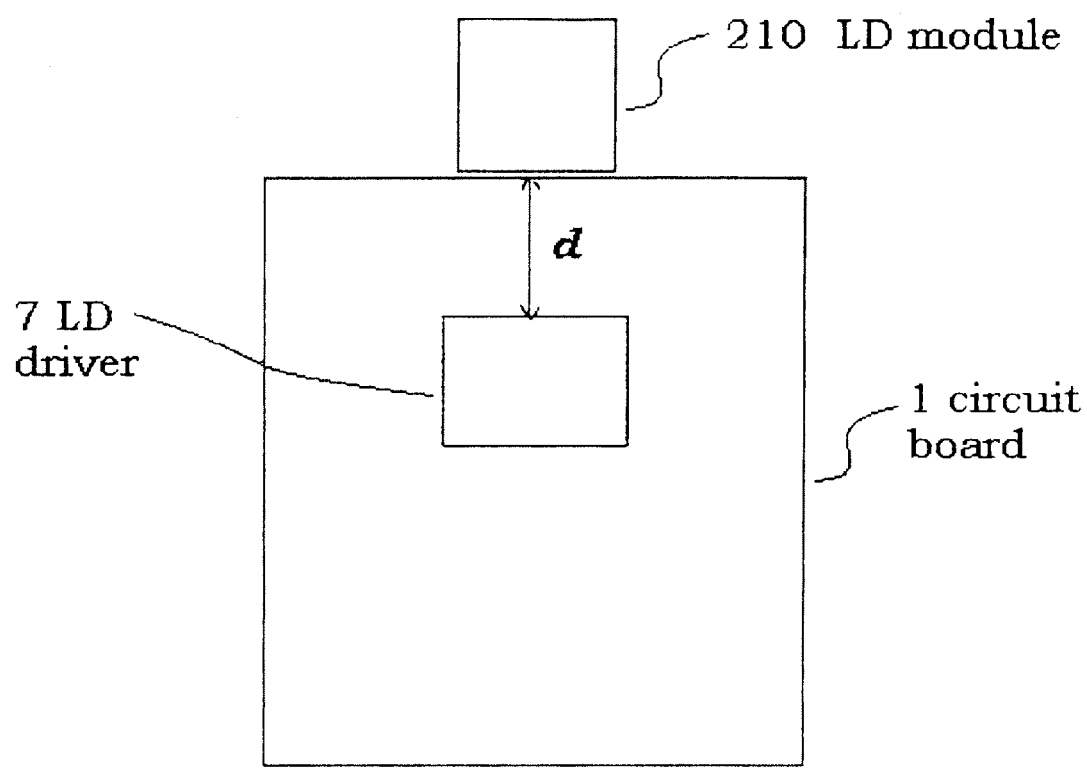
FIG. 25A is an explanatory diagram illustrating the position relationship between an LD module 210 and an LD driver 7 mounted on the circuit board 1.
Figure 25B:
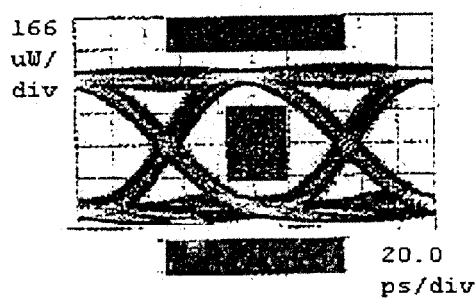
FIGS. 25B and 25C are waveform diagrams showing high frequency signal transmission characteristics measured when the LD driver 7 is disposed near the LD module 210.
Figure 25C:
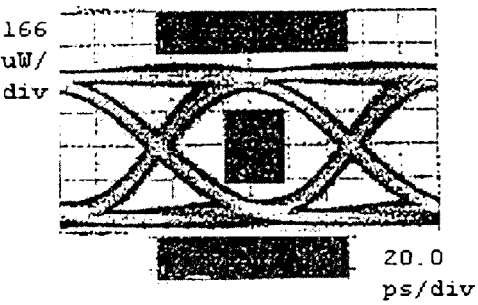

FIG. 25A is an explanatory diagram illustrating the position relationship between an LD module 210 and an LD driver 7 mounted on the circuit board 1. FIGS. 25B and 25C are waveform diagrams showing high frequency signal transmission characteristics measured when the LD driver 7 is disposed near the LD module 210. The transmission characteristics are significantly varied depending on a distance (d) between the LD module 210 and the LD driver 7 as shown in FIG. 25A. In FIG. 25B, the waveform diagram with a roll-off filter is taken when the distance (d) is 4.0 mm and the resulting data are ER=6.7 dB, Po=−3.0 dBm, bias=42.0 mA and mask margin=17%. In FIG. 25C, the waveform diagram with a roll-off filter is taken when the distance (d) is 5.0 mm and the resulting data are ER=6.5 dB, Po=−3.0 dBm, bias=41.5 mA and mask margin=14%. Thus, it is found that, due to 1 mm elongation of the distance (d) from 4 mm to 5 mm, the extinction ratio (ER) is by 0.2 dB reduced from 6.7 dB to 6.5 dB and the mask margin is by 3% reduced from 17% to 14% as well. Therefore, it is advantageous that the distance (d) is shortened as much as possible.

Furthermore, it is desired that a distance provided between a pad end for a lead terminal of the LD driver 7 and a pad for a lead terminal of the LD subassembly 182 (the subassembly terminal 184 in FIG. 7) is 5 mm or less, and it is 1.6 mm in the present embodiment. It is desired that a distance provided between the pad end for the lead terminal of the LD driver 7 and a pad for a lead terminal of the CDR 8 is 10 mm or less, and it is 3 mm in the present embodiment.

Reception Side:

Since an electrical signal output from the PD device is feeble, the PD subassembly 183 has a built-in preamplifier without exception. Thus, even if the circuit length between the preamplifier and the CDR 8 becomes long in some degree, or even if impedances deviate in some degree, the preamplifier can output amplitude for overcoming such problems as mentioned above. Furthermore, a deterioration in a waveform appeared between the preamplifier and the CDR 8 is allowable in some degree so far as it is within a range which is recognized by the CDR 8. Moreover, since an output standard specification for the CDR 8 is more severely designed than an input standard specification for communication equipment, even if a waveform deteriorates in some degree between the CDR 8 and the card edge region 186, the external standard specification (for the communication equipment) can be sufficiently satisfied. Due to the reason as described above, even if a flexible region is placed at any position on the reception side, the properties thereof are not severely affected as in the case of the transmission side.

As described above, since high-frequency parts such as the LD driver 7, and the CDR 8 are mounted on the circuit board main body 2a in the transmission/reception optical module 81 containing the circuit board 1, the high-frequency parts are located in the vicinity of the LD subassembly 182, so that a deterioration of a signal is suppressed to the minimum. As a result, it is possible to realize signal transmission at a rate of 1 Gbit/s or higher, particularly a high speed signal transmission at a rate of 5 Gbit/s or higher, and still further, 10 Gbit/s or higher.

Meanwhile, as mentioned above, a material of the casing is essentially made from Al or Zn having coefficients of linear expansion of $23\times10^{-6}/°$ C. and $30\times10^{-6}/°$ C., respectively. On the other hand, a coefficient of linear expansion of a rigid substrate is 10 to $15\times10^{-6}/°$ C. in case of using a usual glass epoxy material which is smaller than the coefficient of linear expansion in a material of the casing. Accordingly, when an optical transceiver is used while changing an ambient temperature, amounts of thermal expansion produced in the casing and the circuit board become different from one another.

However, since one end of the circuit board is screwed to the casing, and the other end thereof is soldered and fixed to the leads 182R and 183R of the LD subassembly 182 and the PD subassembly 183, stresses derived from thermal expansion concentrate totally at the solder fixation region, resulting in breakdown of the solder.

On the other hand, according to the optical transceiver 81 containing the circuit board 1 of the present embodiment, since an area provided between the circuit board main body 2a and the optical reception subassembly fixation region 4 is composed of the flexible region 6P and an area provided between the circuit board main body 2a and the circuit board main body 2b is composed of the flexible region 6, thermal expansion derived from temperature changes can be absorbed by the flexible regions 6 and 6P, so that stresses due to thermal expansion do not concentrate in the solder fixation region, resulting in no breakdown of the solder.

Furthermore, since the lead 182R of the LD subassembly 182 is made of kovar or an iron-base material of, for example, 0.5 mm or less diameter, matching of impedances is impossible or difficult. Hence, when a gap appears in a region extending from an end of the circuit board to the LD device, a high frequency signal propagates the lead 182R in the gap, so that the signal deteriorates. Such trouble is remarkable particularly in case of transmitting a signal of 10 Gbit/s or higher. Accordingly, a gap appearing in the region extending from the end of the circuit board to the LD device is ideally zero.

In the circuit board 181 shown in FIG. 1, the circuit board is fixed to the casing by screws, and the LD subassembly 182 is fitted in the casing to be secured. Accordingly, a gap appears in the region extending from the end of the circuit board to the LD device in the case where a length provided between a screw fixation region and an end of the circuit board 181 deviates due to a manufacture precision of the circuit board 181, or the whole lengths of the LD subassembly 182 and the PD subassembly 183 deviate. Even if there is no deviation, a gap must be previously formed, because a predetermined gap is allowed for a possible deviation, so that there is a gap in any case.

On the contrary, in the optical transceiver 81 containing the circuit board 1, since an area provided between the circuit main body 2a and the optical reception subassembly fixation region 4 is composed of the flexible region 6P, there is no need to provide a gap between an end of the circuit board main body 2a and the LD device, so that a lead length of the LD subassembly or the PD subassembly can be shorten to the minimum. In other words, the LD subassembly 182 may be allowed to be close to the end of the circuit board main body 2a as much as possible. Thus, a high speed transmission of 5 Gbit/s or higher can be realized.

As described above, the optical transceiver 81 according to the present embodiment is characterized by that an area where is particularly worried about a signal deterioration (e.g.

an area positioned between the LD device and the LD driver 7, or an area positioned between the LD device and the CDR 8) is disposed on a rigid region (e.g. the circuit board main body 2a), while only an area where is not worried comparatively about a signal deterioration (e.g. an area positioned between the circuit board main body 2a and the PD subassembly fixation region 4, and an area positioned between the circuit board main body 2a and the circuit board main body 2b) is composed of a flexible region, whereby the above-mentioned functions and advantageous effects are realized.

Figure 12:
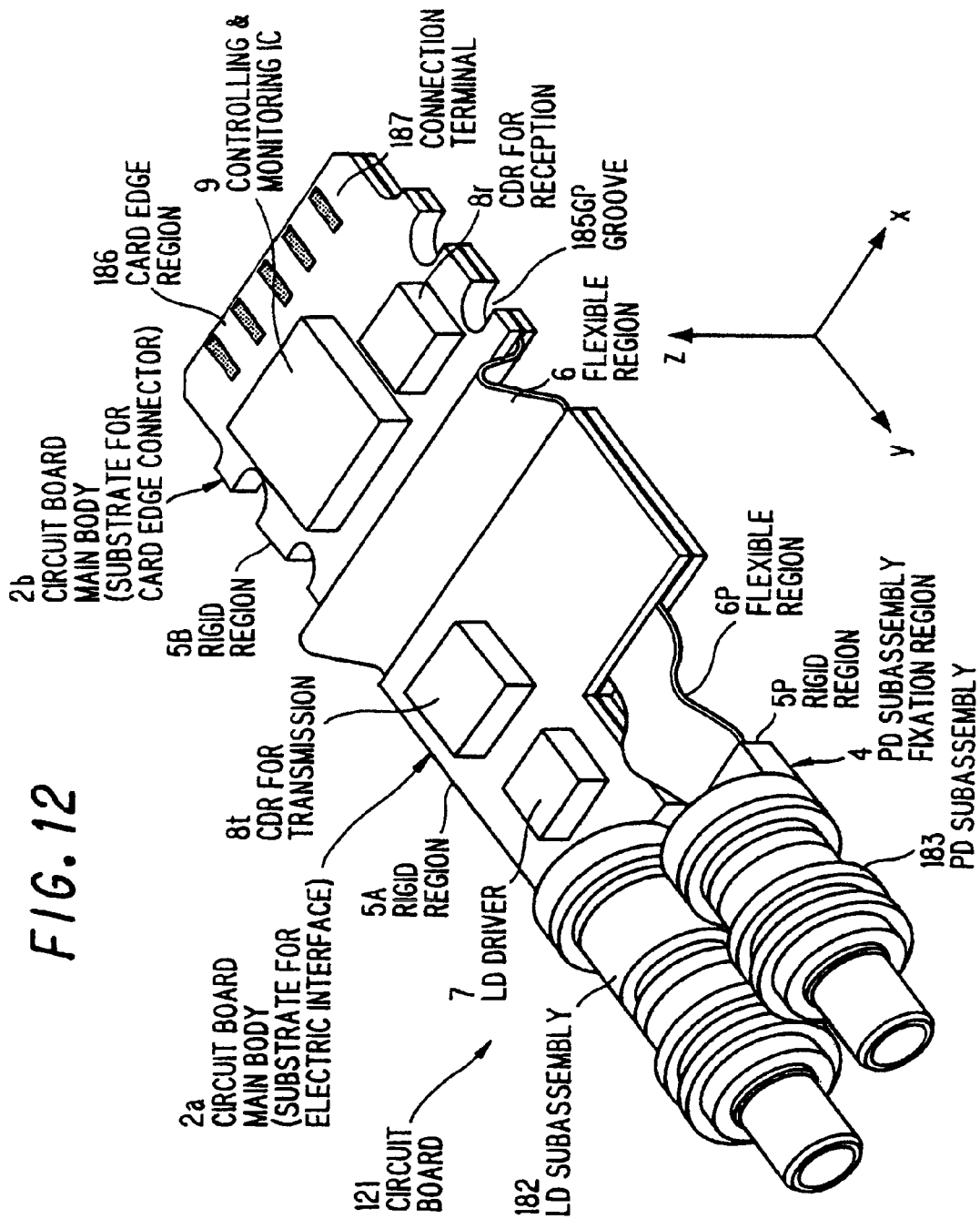
FIG. 12 is a perspective view showing a modification of the circuit board of FIG. 6.

A CDR is not only the CDR 8 of a one-chip type which is an integral-type transmittor/receiver, but also a CDR of a two-chip type containing separately transmitting and receiving functions is commercially available. In this case, as a modification of the circuit board 1 shown in FIG. 6, a CDR 8t for transmission purpose which shapes a waveform of an electrical signal input to an LD subassembly 182 is mounted opposite to an end of an LD driver 7 which is mounted on a circuit board main body 2a wherein the other end of the LD driver is opposed to the LD subassembly 182 as in a circuit board 121 shown in FIG. 12. Furthermore, a CDR 8r for reception purpose which shapes a waveform of an electrical signal output from a PD subassembly 183 is mounted on the side of an end of a controlling & monitoring IC 9 disposed on a circuit board main body 2b wherein on the side the CDR 8r is placed corresponds to the side on which the PD subassembly 183 is attached.

The reason why the CDR 8r for reception purpose is mounted on the circuit board main body 2b is in that a reception signal deteriorated by a flexible region 6 is efficiently shaped thereby.

In the following, a second embodiment of the present invention will be described.

Figure 14:
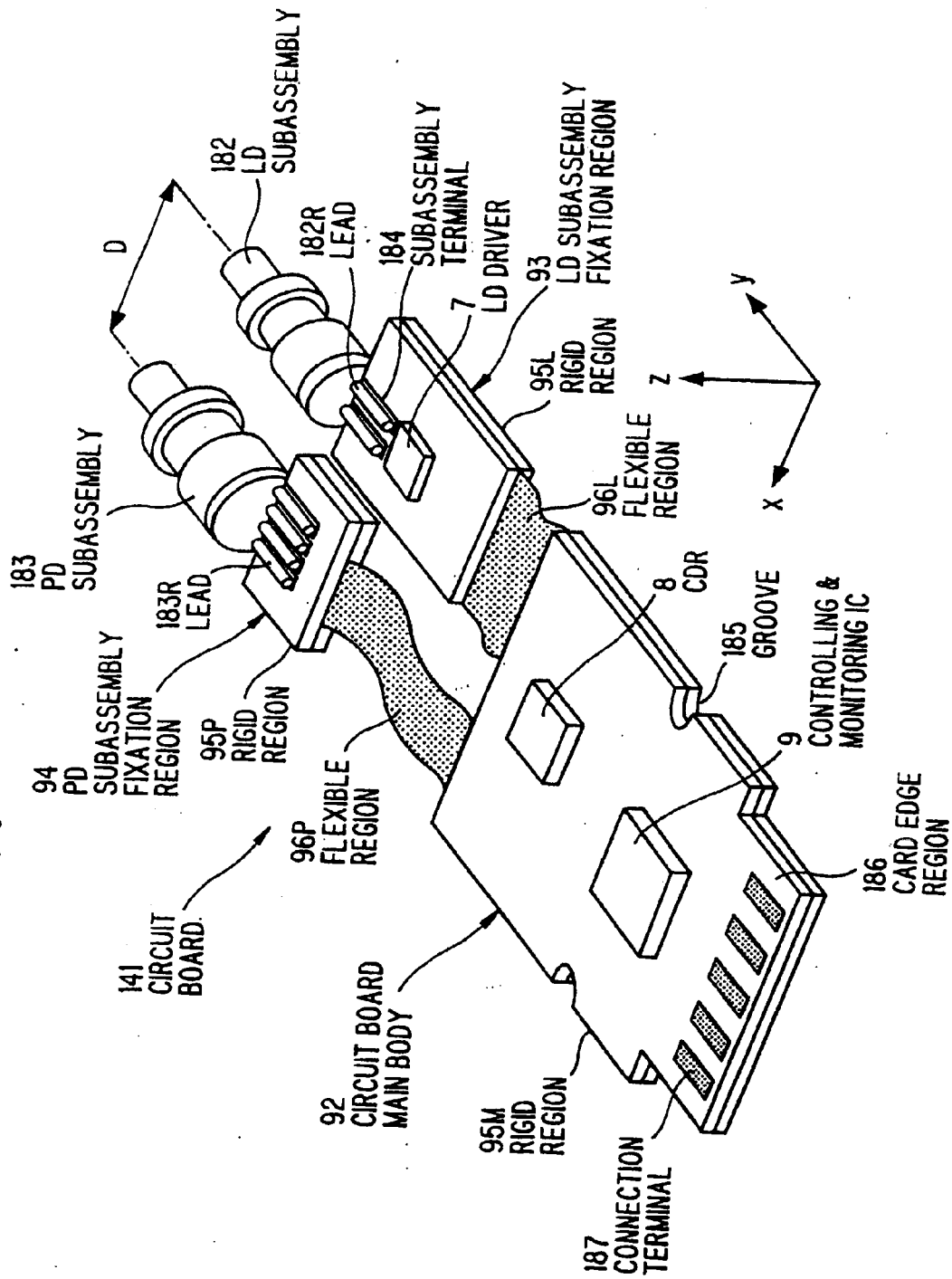
FIG. 14 is a perspective view showing a second embodiment of the present invention.

As shown in FIG. 14, a whole circuit board 141 is formed into one member by a rigid/flexible substrate wherein a circuit board main body 92, an LD subassembly fixation region 93 for mounting an LD subassembly 182, which is located apart from an end of the circuit main body 92 in its longitudinal direction (+y direction in FIG. 14) with a predetermined distance, and a PD subassembly fixation region 94 for mounting a PD subassembly 183, which is located apart from the end of the circuit main body 92 in the longitudinal direction with a predetermined distance, are composed of rigid regions 95M, 95L, and 95P, respectively. On one hand, an area provided between the circuit main body 92 and the LD subassembly fixation region 93, and an area provided between the circuit board main body 92 and the PD subassembly fixation region 94 are composed of a flexible region 96L for adjusting a variety of dispersions and a flexible region 96 P for adjusting a variety of dispersions, respectively.

An LD driver 7 is mounted on the LD subassembly fixation region 93, and the LD subassembly 182 is secured to an end of the LD subassembly fixation region 93 in the vicinity of the LD driver 7. The PD subassembly 183 is secured to an end of the PD subassembly fixation region 94. A CDR 8 is mounted on an end of the circuit board main body 92 a side of which is opposed to the LD and PD subassembly fixation regions 92 and 93, and a controlling & monitoring IC 9 is mounted on the other side opposite to the end of the CDR 8.

As mentioned above, this is because a circuit constitution provided between the CDR 8 and the LD device is important, so that contrivances such that a circuit length is made to be the shortest, and that a via is excluded are required. In more detail, an area positioned between the LD driver 7 and the LD device is in a far severe situation than that positioned between the CDR 8 and the LD driver 7. On one hand, since a wiring is complicated in an area positioned between the CDR 8 and the controlling & monitoring IC 9, it is preferred that flexible regions are not used for these areas. These facts are the same as in the other embodiments which will be described hereinafter.

Operations of the second embodiment are described herein.

In the circuit board 141, the circuit board main body 92 is connected with the LD subassembly fixation region 93 through the flexible region 96L, and the circuit board main body 92 is connected with the PD subassembly 94 through the flexible region 96P, respectively. Thus, for example, when the LD subassembly fixation region 93 and/or the PD subassembly fixation region 94 are moved vertically (±z directions in FIG. 14) in case of incorporating the circuit board 141 into the casing 31 (see FIG. 8), dispersions due to different positions of leads 182R and 183R in the LD subassembly 182 and the PD subassembly 183 may be absorbed by the flexible regions 96L and 96P to be adjusted.

Moreover, when the LD subassembly fixation region 93 and/or the PD subassembly fixation region 94 are moved in the length direction thereof (±y direction in FIG. 14), a dispersion in an individual each of the LD subassembly 182 and/or the PD subassembly 183 wherein the central axes of them are aligned respectively is absorbed by the flexible region 96L or the flexible region 96P, so that the dispersion can be adjusted.

Furthermore, when the LD subassembly fixation region 93 and/or the PD subassembly fixation region 94 are somewhat rotated around the optic axis, a dispersion due to a difference in secured conditions of the LD subassembly 182 and/or the PD subassembly 183 is absorbed by the flexible regions 96L and 96P, so that the dispersion can be adjusted.

Since the circuit board 141 is formed into one member by the use of a rigid/flexible substrate, both the circuit board main body 92 and the LD subassembly fixation region 93 as well as the circuit board main body 92 and the PD subassembly fixation region 94 may be electrically connected through the flexible regions 96L and 96P, respectively, without soldering the respective opposite ends of the flexible regions 96L and 96P to constitute the circuit board 141.

When the card edge region 186 is attached to and detached from an electrical connector contained in communication equipment (not shown), a large force is applied to the circuit board 141. However, since the force is absorbed by the flexible region 96L or 96P, forces (stresses) to be applied to the circuit board 141, the LD subassembly 182, and the PD subassembly 183 can be moderated by the flexible regions 96L and 96P in case of attaching them to and detaching them from communication equipment. Due to the same reason as that described above, a stress appearing in case of attaching and detaching an optical connector can be also moderated.

According to a transmission/reception optical module containing the circuit board 141 wherein the LD driver 7 is mounted on the LD subassembly fixation region 93, and the CDR 8 is mounted on the circuit board main body 92, a high speed transmission can be realized at a signal transmission rate of from 1 Gbit/s or higher to around 5 Gbit/s.

The other functions and advantageous effects are the same as those of the circuit board 1 shown in FIG. 6.

On the other hand, it may be constituted unlike the first and second embodiments in such that the circuit board main body 92 and the PD subassembly fixation region 94 are formed into one member by a rigid region, and the LD subassembly fixation region 93 is also formed by a rigid region, while only the circuit board main body 92 is connected with the LD subassembly fixation region 93 through a flexible region. In this case, a variety of dispersions and deviations appearing in case of assembling respective parts can be overcome by forming the leads 183R of the PD subassembly 183. As a result of the forming, the same functions and advantageous effects can be obtained as those of the circuit board 1 shown in FIG. 6 (in addition to such an advantage that a lead length of the PD subassembly 183 can be made to be the shortest).

A third embodiment of the present invention will be described.

Figure 15:
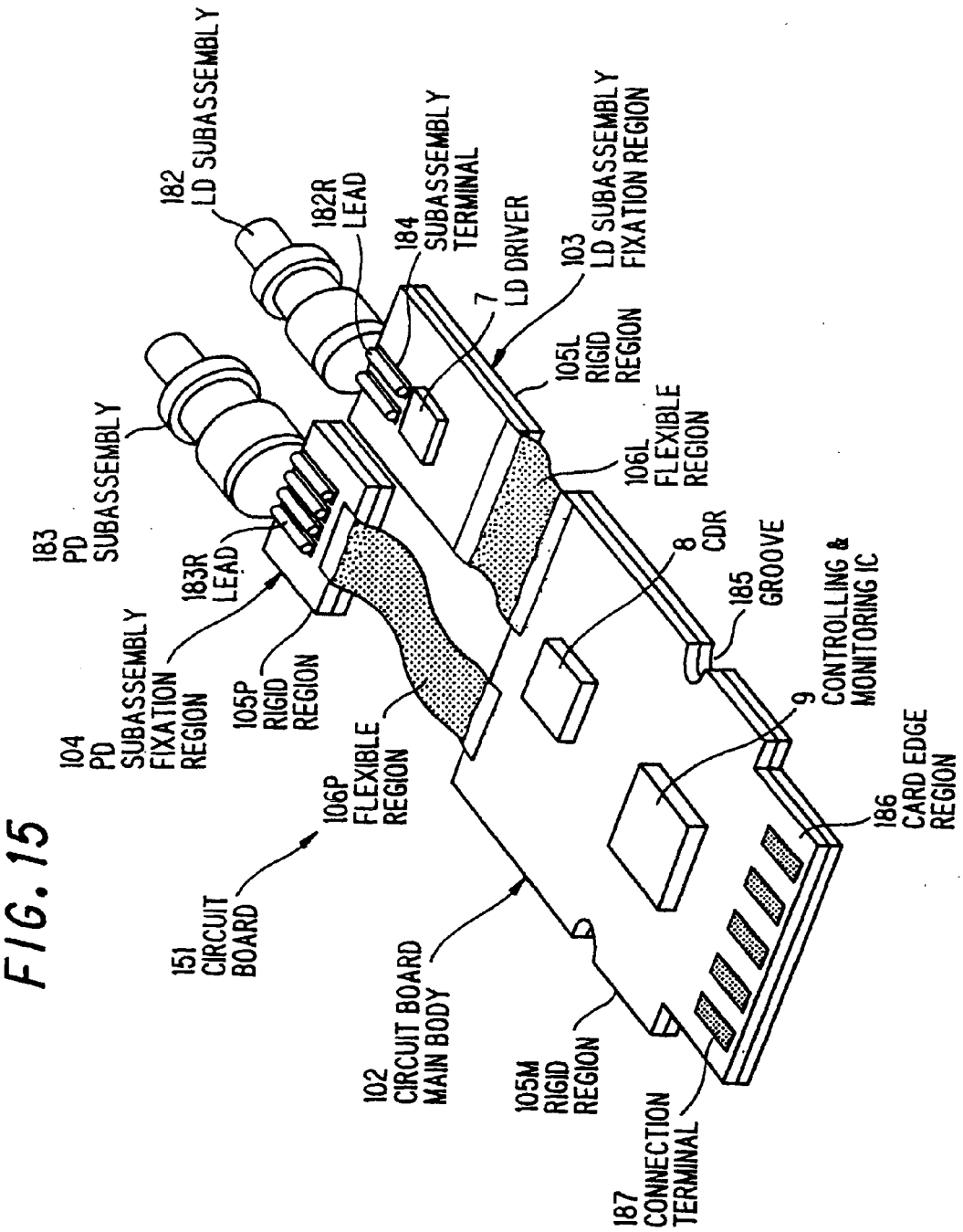
FIG. 15 is a perspective view showing a third embodiment of the present invention.

In a circuit board 151 as shown in FIG. 15, a circuit board main body 102 is formed by a rigid substrate 105M, an LD subassembly fixation region 103 is formed by a rigid substrate 105L, and a PD subassembly fixation region 104 is formed by a rigid substrate 105P, while the circuit board main body 102 is connected with the PD subassembly fixation region 104 through a flexible substrate 106L, and the circuit board main body 102 is connected with the PD subassembly fixation region 104 through a flexible substrate 106P wherein these flexible substrates 106L and 106P are used for adjusting a variety of dispersions in LD and PD subassemblies 182 and 183.

Assembly of the circuit board 151 is made as follows. For instance, the circuit board main body 102 (made of the rigid substrate 105M), the LD subassembly fixation region 103 (made of the rigid substrate 105L), the PD subassembly fixation region 104 (made of the rigid substrate 105P), the flexible substrate 106L, and the flexible substrate 106P are fabricated separately from one another. The LD subassembly fixation region 103 and the PD subassembly fixation region 104 are placed apart from the circuit board main body 102, respectively, and a surface of the LD subassembly fixation region 103 is connected with a surface of the circuit board main body 102 through the flexible substrate 106L by the use of a solder or an adhesive, while an end of a surface of the PD subassembly fixation region 104 is connected with an end of the surface of the circuit main body 102 through the flexible substrate 106P at the opposite ends thereof.

The remaining constitutions of the circuit board 151 are the same as those of the circuit board 141 shown in FIG. 14. The same functions and advantageous effects in the circuit board 141 are obtained in also the circuit board 151.

The respective substrates are not formed into one member in the circuit board 151, but they are separately fabricated from one another, so that some parts of the substrates may be replaced in accordance with applications and specifications of the circuit board 151 or in response to standards of the LD subassembly 182 and the PD subassembly 183. Furthermore, there is also such an advantage that the circuit board 151 is more easily fabricated than the circuit board 141.

On one hand, unlike the above-described third embodiment, it may be arranged in such that the circuit board main body 102 and the PD subassembly fixation region 104 are formed into one member by a rigid substrate, the LD subassembly fixation region 103 is formed by a rigid substrate, and the circuit board main body 102 is connected with the LD subassembly fixation region 103 through a flexible substrate. In this case, a variety of dispersions and deviations appearing in case of assembling respective parts can be responded by forming leads 183R of the PD subassembly 183. As a result of the forming, the same functions and advantageous effects can be obtained as those of the circuit board 1 shown in FIG. 6 (except for such an advantage that a lead length of the PD subassembly 183 can be made to be the shortest).

A fourth embodiment of the present invention will be described.

Figure 16:
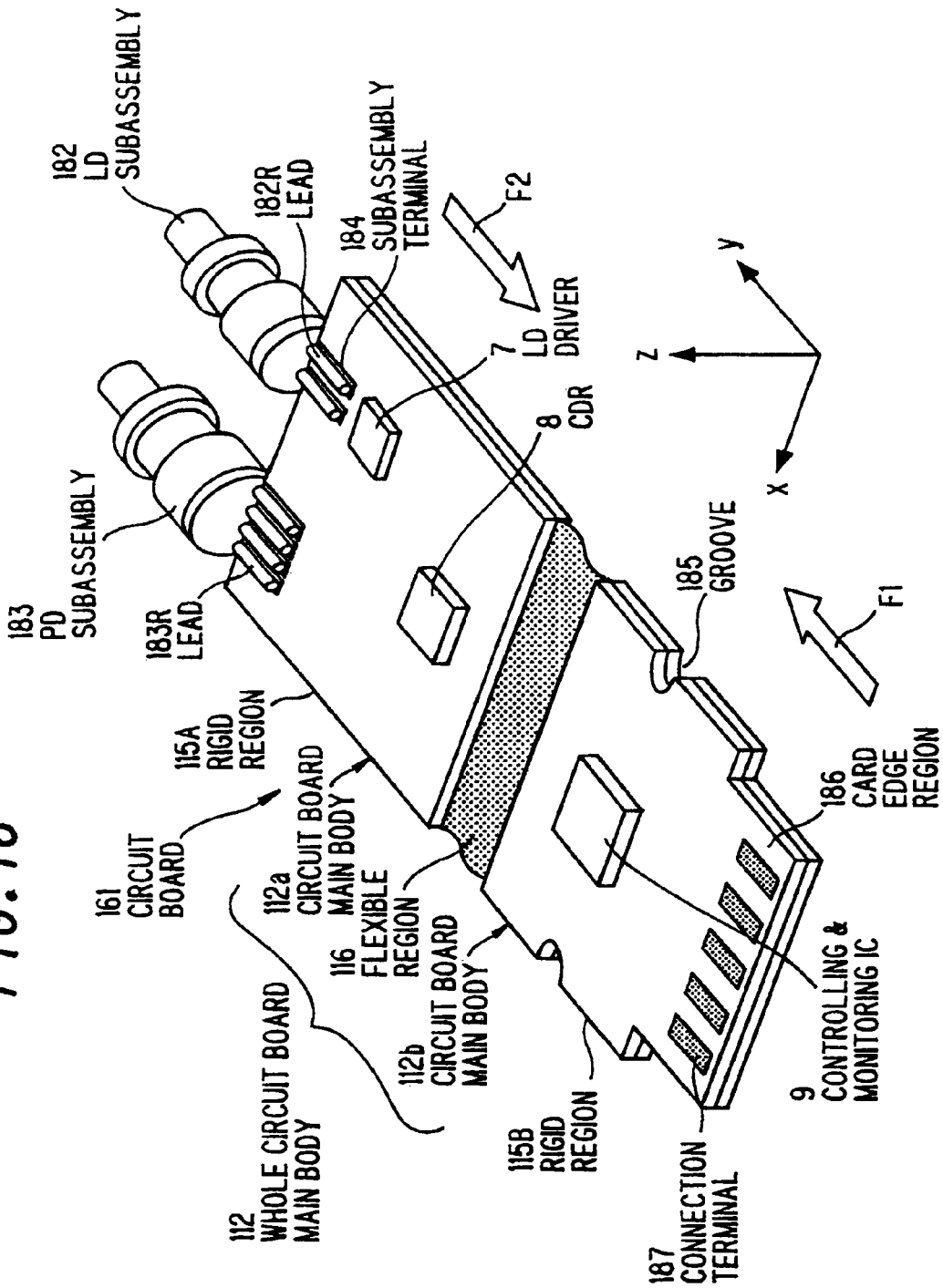
FIG. 16 is a perspective view showing a fourth embodiment of the present invention.

As shown in FIG. 16, a whole circuit board 161 is formed into one member by a rigid/flexible substrate, and a part of a whole circuit board main body 112 is formed by a flexible region 116 of the rigid/flexible substrate.

More specifically, in the circuit board 161, a circuit board main body (a substrate for an electric interface) 112a being one side of the whole circuit board main body 112 onto which an LD subassembly 182 and a PD subassembly 183 are secured is formed by a rigid region 115A, and a circuit board main body (a substrate for a card edge connector) 112b being situated on the opposite side to that described above of the whole circuit board main body 112 onto an end of which a card edge region 186 is constituted is formed by a rigid region 115B. The circuit board main body 112a is connected with the circuit board main body 112b through the flexible region 116. In the present embodiment, a width of the whole circuit board main body 112 is made to be equal to that of the flexible region 116.

An LD driver 7 is mounted on the circuit board main body 112a, the LD subassembly 182 is secured to an end of the circuit board main body 112a in the vicinity of the LD driver 7, and a CDR 8 is fixed to the circuit board main body 112a at the side opposite to the LD subassembly 182. The PD subassembly 183 is secured to the end of the circuit board main body 112a on the side adjacent to the LD subassembly 182. A controlling & monitoring IC 9 is mounted on the circuit board main body 112b.

In the circuit board 161, dispersions in lengths of the LD subassembly 182 and the PD subassembly 183 are absorbed by such a manner that each length of leads 183R is adjusted, and then a gap d is provided between an end of the PD subassembly 183 and an end of the circuit board main body 112a, to which the PD subassembly 183 is secured, in case of securing the PD subassembly 183 to the circuit board main body 112a as shown in FIG. 17A, so that the absorption is achieved by the gap d.

Moreover, deviations (height dispersions) of the LD subassembly 182 and the PD subassembly 183 in the vertical direction are absorbed by bending suitably (forming) the leads 183R in case of securing the PD subassembly 183 to the circuit board main body 112a as shown in FIG. 17B.

Although a large force F1 in +y direction and a large force F2 in −y direction are applied to the circuit board 161 in case of attaching the card edge region 186 to and detaching the card edge region 186 from an electric connector contained in communication equipment (not shown), the forces F1 and F2 are absorbed by the flexible region 116. Accordingly, the forces (stresses) F1 and F2 applied to the circuit board 161, the LD subassembly 182, and the PD subassembly in case of attaching and detaching the card edge region 186 to and from the communication equipment can be moderated. Due to the same reason as described above, stresses in case of attaching and detaching an optical connector can be also moderated.

Therefore, stresses are scarcely applied to a connection region of the LD subassembly 182 and the circuit board main body 112a, and a connection region of the PD subassembly 183 and the circuit board main body 112a, so that cracks appear hardly in soldered portions.

Furthermore, since the circuit board 161 is formed into one member by a rigid/flexible substrate, the circuit board main body 112a may be electrically connected with the circuit board main body 112b to constitute the circuit board 161 without using any solder at opposite sides of the flexible region 116.

A fifth embodiment will be described herein.

Figure 18:
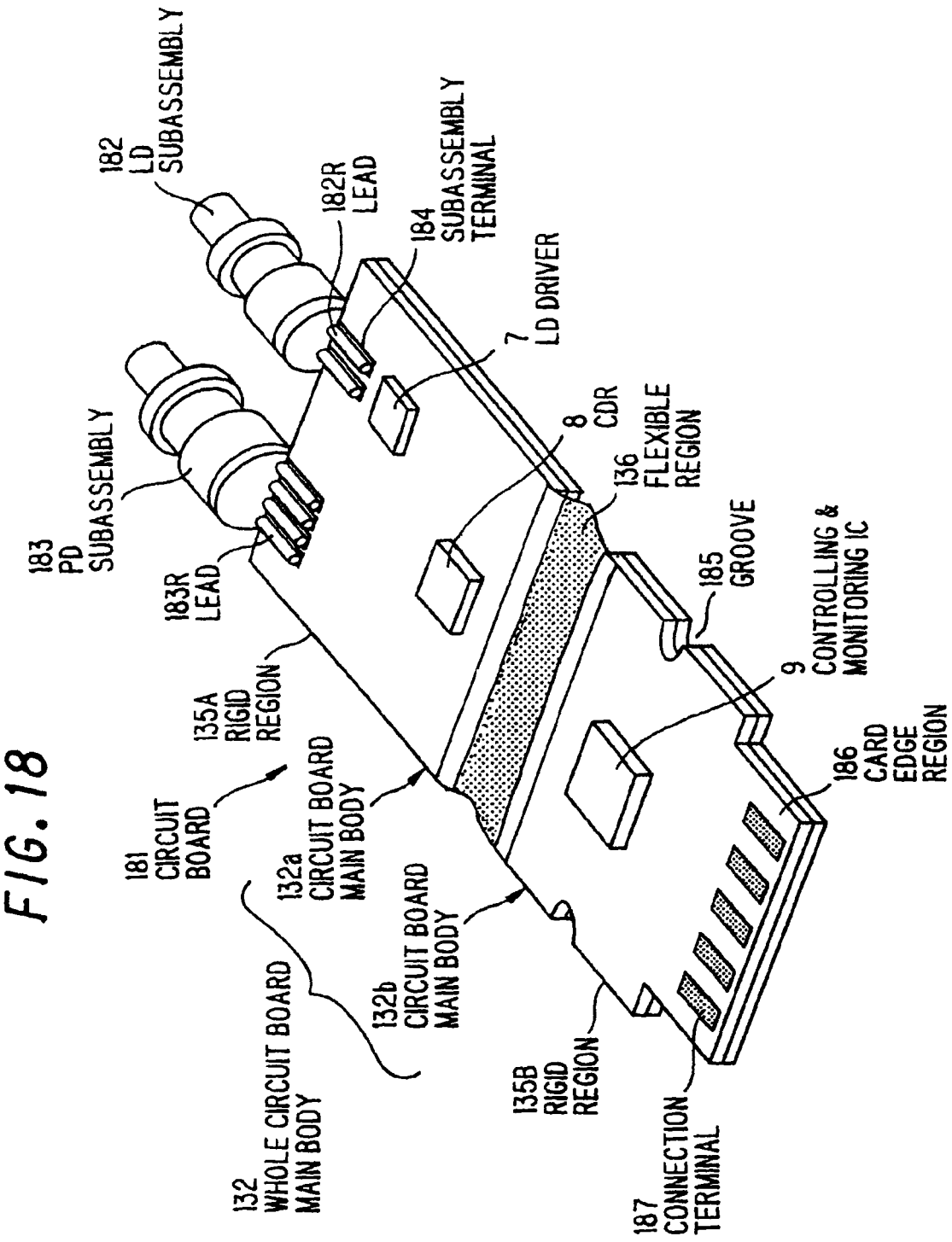
FIG. 18 is a perspective view showing a fifth embodiment of the present invention.

As shown in FIG. 18, a circuit board 181 is fabricated by such a manner that a whole circuit board main body 132 is divided into two sections wherein a section corresponding to a circuit board main body (a substrate for an electric interface)

132$a$ situated on one side of the circuit board 181 is formed by a rigid substrate 135A, while the other section corresponding to a circuit board main body (a substrate for a card edge connector) 132$b$ situated on the other side of the circuit board 181 is formed by a rigid substrate 135B, and the opposed ends of the circuit board main body 132$a$ and the circuit board main body 132$b$ are connected through a flexible substrate 136. In the present embodiment, each width of the circuit board main bodies 132$a$ and 132$b$, and a width of the flexible substrate 136 are made to be equal to each other, A manner for assembling the circuit board 181 is as follows. For instance, the circuit board main body 132$a$ (made of the rigid substrate 135A), the circuit board main body 132$b$ (made of the rigid substrate 135B), and the flexible substrate 136 are fabricated separately from one another. The circuit board main body 132$a$ is placed apart from the circuit board main body 132$b$, and a surface on an end of the circuit board main body 132$a$ opposed to the circuit board main body 132$b$ is connected with a surface on the opposed end of the circuit board main body 132$b$ through the flexible substrate 136 by the use of a solder or an adhesive at the opposite ends of the flexible substrate 136.

In also the circuit board 181, dispersions in lengths of an LD subassembly 182 and a PD subassembly 183 are absorbed as shown in FIG. 17A in accordance with the same manner as that of the circuit board 161 of FIG. 16, while deviations of the LD subassembly 182 and the PD subassembly 183 in the vertical direction are absorbed by the same manner as that shown in FIG. 17B.

The remaining constitutions of the circuit board 181 are the same as those of the circuit board 161 shown in FIG. 16. According to the circuit board 181, the same functions and advantageous effects of the circuit board 161 are obtained.

The respective substrates are not formed into one member in the circuit board 181, but they are separately fabricated from one another, so that some parts of the substrates may be replaced in accordance with applications and specifications of the circuit board 181 or in response to standards of the LD subassembly 182 and the PD subassembly 183. Furthermore, there is also such an advantage that the circuit board 181 is more easily fabricated than the circuit board 161.

In the following, modified examples of the second to fifth embodiments wherein a two-chip type CDR is used will be described by referring to FIGS. 19 through 22.

Figure 19:
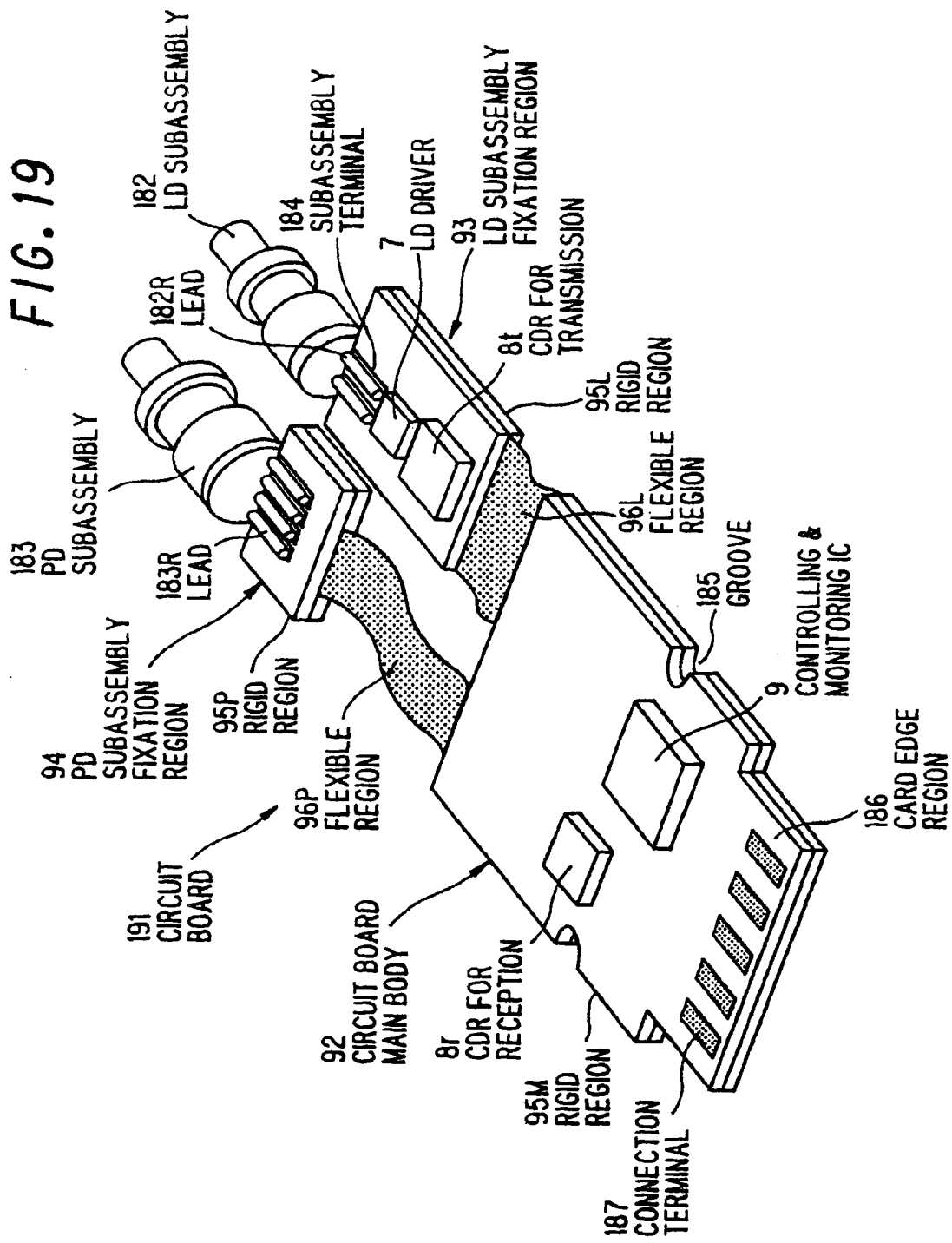
FIG. 19 is a perspective view showing a modification of the circuit board of FIG. 14.
Figure 20:
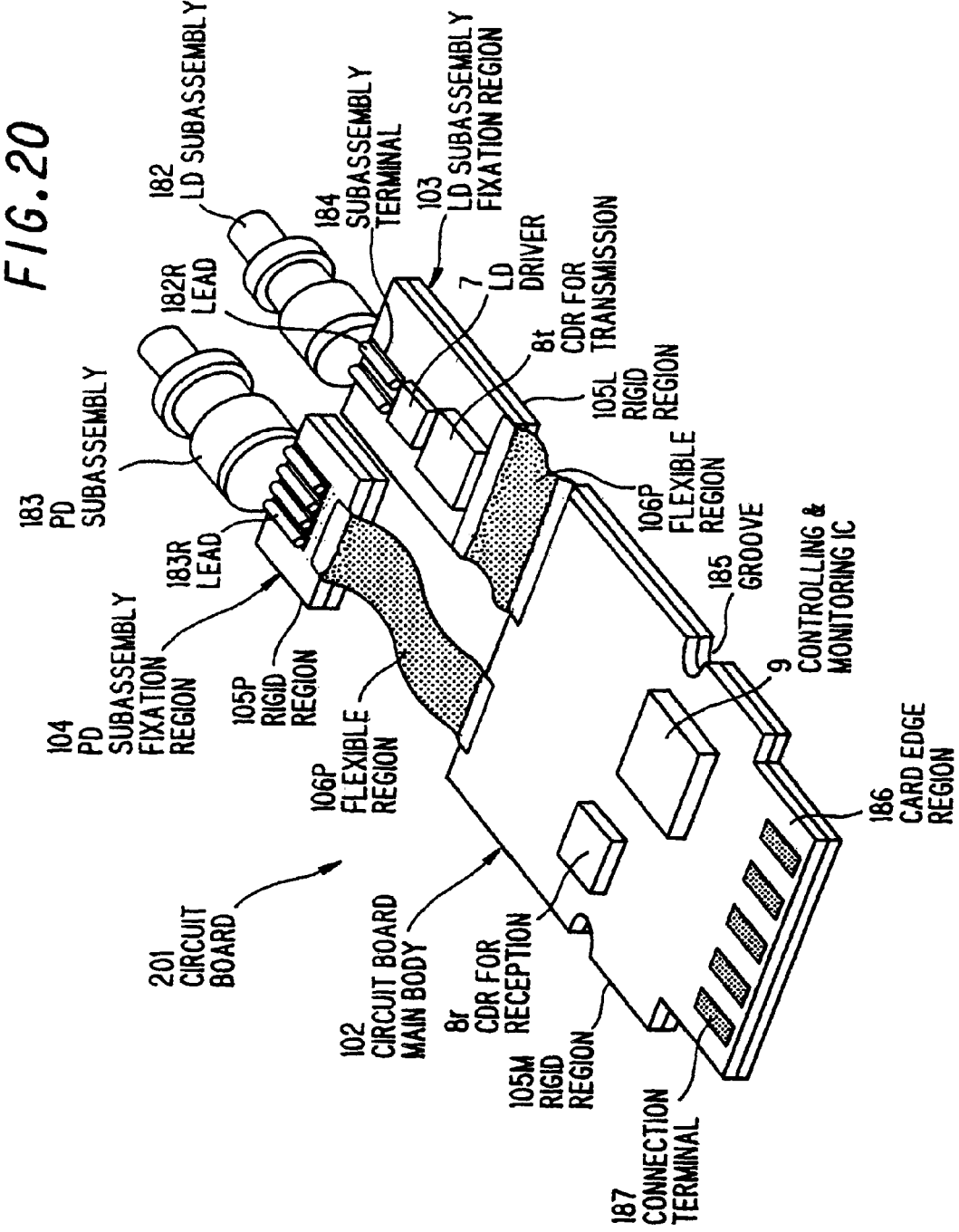
FIG. 20 is a perspective view showing a modification of the circuit board of FIG. 15.

In a circuit board 191 shown in FIG. 19 wherein the circuit board 191 is a modification of the circuit board 141 of FIG. 14, a CDR 8$t$ for transmission purpose is disposed on the side opposed to an LD driver 7 mounted on a LD subassembly fixation region 93, while a CDR 8$r$ for reception purpose is disposed on the side belongs to a side on which a PD subassembly 183 is situated in parallel to a controlling & monitoring IC 9 mounted on a circuit board main body 92. A CDR 8$t$ and a CDR 8$r$ in a circuit board 201 shown in FIG. 20 wherein the circuit board 201 is a modification of the circuit board 151 of FIG. 15 are in the same situations as those of FIG. 19.

Figure 21:
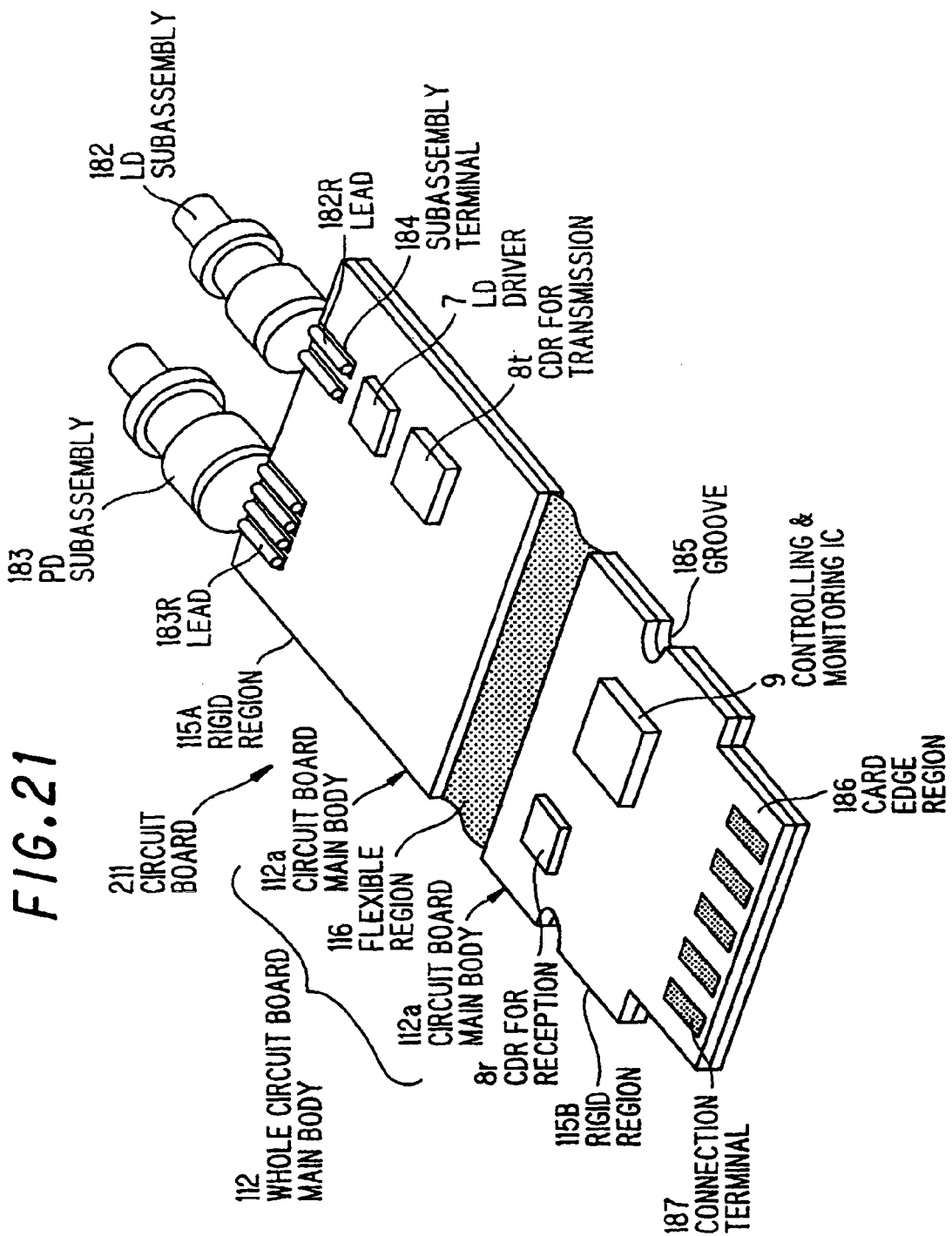
FIG. 21 is a perspective view showing a modification of the circuit board of FIG. 16.
Figure 22:
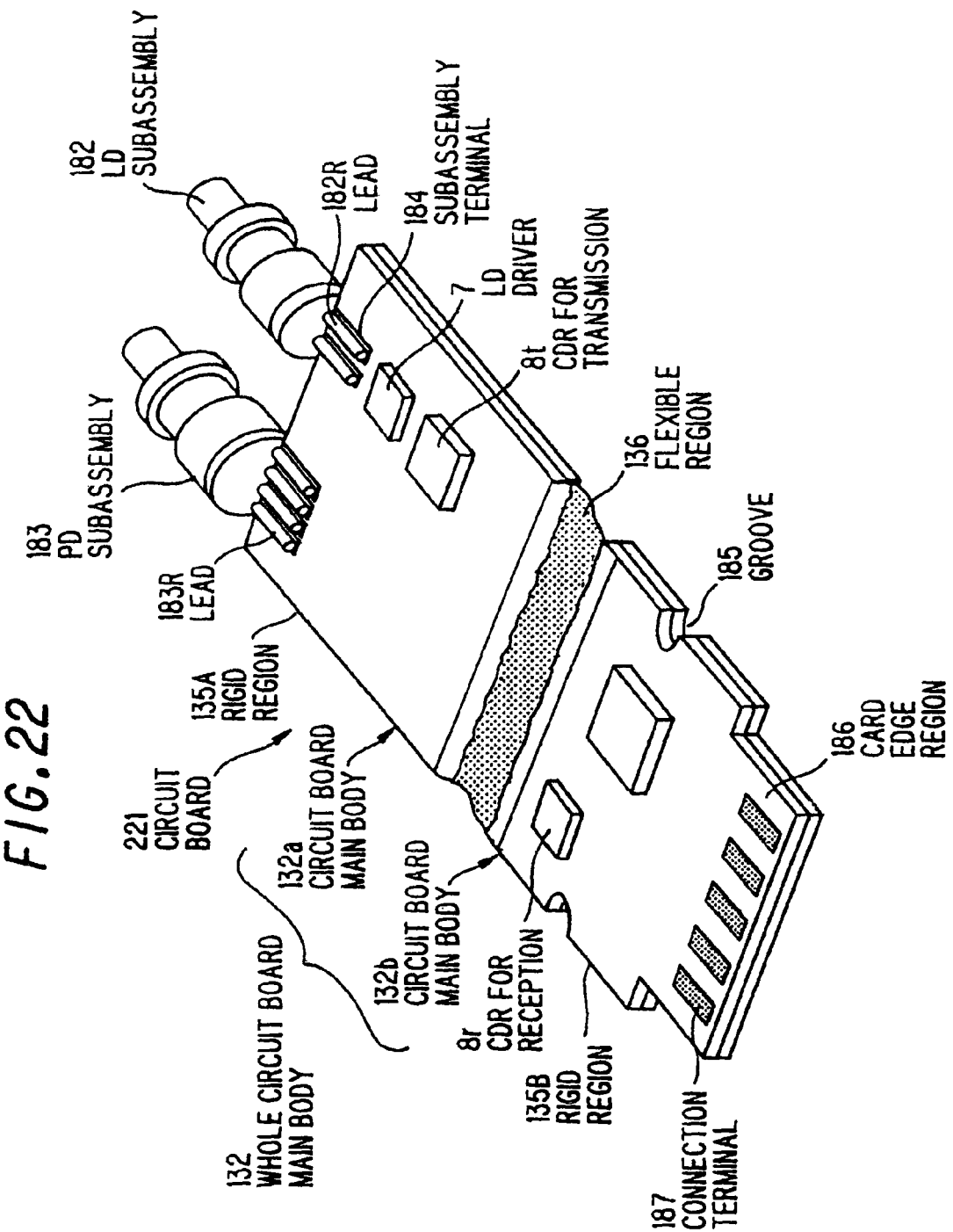
FIG. 22 is a perspective view showing a modification of the circuit board of FIG. 18.

In a circuit board 211 shown in FIG. 21 wherein the circuit board 211 is a modification of the circuit board 161 of FIG. 16, a CDR 8$t$ for transmission purpose is disposed on the side opposed to an LD driver 7 mounted on a circuit board main body 112$a$, while a CDR 8$r$ for reception purpose is disposed on the side belongs to a side on which a PD subassembly 183 is situated in parallel to a controlling & monitoring IC 9 mounted on a circuit board main body 112$b$. A CDR 8$t$ and a CDR 8$r$ in a circuit board 221 for a transmission/reception optical module shown in FIG. 22 wherein the circuit board 221 is a modification of the circuit board 181 of FIG. 18 are in the same situations as those of FIG. 21.

A circuit board contained in the transmission/reception optical module according to the present invention is not limited to those mentioned in the above respective embodiments, but a suitable combination of the above embodiments (for example, a combination of the circuit board 141 of FIG. 14 and the circuit board 161 of FIG. 16) is also applicable.

According to the present invention, the following excellent advantages are achieved.

(1) A thermal expansion due to temperature changes can be absorbed by a flexible region according to the present invention.

(2) A variety of deviations, dispersions, and stresses due to dispersions can be absorbed by a flexible region according to the present invention.

(3) Since a lead length of an optical transmission subassembly or an optical reception subassembly can be made to be the shortest, a high speed transmission at a rate of 5 Gbit/s or higher can be realized.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A transmission/reception optical module, comprising:
   an optical transmission subassembly including a light-emitting element and a monitor light-receiving element for monitoring an optical output of the light-emitting element;
   an optical reception subassembly including a light-receiving element and a preamplifying element for amplifying an output of the light-receiving element; and
   a circuit board for controlling the optical transmission subassembly and the optical reception subassembly;
   the circuit board being formed into one member by a rigid-flexible substrate comprising rigid regions and flexible regions wherein a circuit board main body, an optical transmission subassembly fixation region, and an optical reception subassembly fixation region are comprised of the rigid regions; while the circuit board main body is connected to the optical transmission subassembly fixation region, and the optical reception subassembly fixation region by the flexible regions, and a part of the circuit board main body is comprised of a flexible region;
   wherein a driver for driving the optical transmission subassembly, and a waveform-shaping IC for transmission purposes for shaping a waveform of an electrical signal input to the optical transmission subassembly are mounted on the optical transmission subassembly fixation region, and
   wherein a control circuit for controlling the optical transmission subassembly and the optical reception subassembly, and a waveform-shaping IC for reception purposes for shaping a waveform of an electrical signal output from the optical reception subassembly are mounted on the circuit board main body.

2. A transmission/reception optical module, comprising:
   an optical transmission subassembly including a light-emitting element and a monitor light-receiving element for monitoring an optical output of the light-emitting element;

an optical reception subassembly including a light-receiving element and a preamplifying element for amplifying an output of the light-receiving element; and a circuit board for controlling the optical transmission subassembly and the optical reception subassembly, wherein:

a circuit board main body, and an optical transmission subassembly fixation region and an optical reception subassembly fixation region are comprised of rigid substrates; and wherein the optical transmission subassembly fixation region and the circuit board main body are formed into one body, wherein the optical reception subassembly fixation region and the circuit board main body are connected by a flexible substrate, wherein a driver for driving the optical transmission subassembly is mounted on the optical transmission subassembly fixation region, and wherein a control circuit for controlling the optical transmission subassembly and the optical reception subassembly, and a waveform-shaping IC of a transmission/reception combination type for shaping a waveform of an electrical signal input to the optical transmission subassembly and a waveform of an electrical signal output from the optical reception subassembly are mounted on the circuit board main body.

3. The transmission/reception optical module, as claimed in claim 2, wherein:

the circuit board is divided into two sections, and one section of the circuit board is connected with the other section of the circuit board through the flexible substrate.

4. A transmission/reception optical module, comprising:

an optical transmission subassembly including a light-emitting element and a monitor light-receiving element for monitoring an optical output of the light-emitting element;

an optical reception subassembly including a light-receiving element and a preamplifying element for amplifying an output of the light-receiving element; and a circuit board for controlling the optical transmission subassembly and the optical reception subassembly, wherein:

a circuit board main body, and an optical transmission subassembly fixation region and an optical reception subassembly fixation region are comprised of rigid substrates; and wherein the optical transmission subassembly fixation region and the circuit board main body are connected by a flexible substrate, wherein the optical reception subassembly fixation region and the circuit board main body are formed into one body, wherein a driver for driving the optical transmission subassembly, and a waveform-shaping IC for transmission purposes for shaping a waveform of an electrical signal input to the optical transmission subassembly are mounted on the optical transmission subassembly fixation region, and wherein a control circuit for controlling the optical transmission subassembly and the optical reception subassembly, and a waveform-shaping IC for reception purposes for shaping a waveform of an electrical signal output from the optical reception subassembly are mounted on the circuit board main body.

5. The transmission/reception optical module, as claimed in claim 4, wherein:

the circuit board is divided into two sections, and one section of the circuit board is connected with the other section of the circuit board through the flexible substrate.

6. A transmission/reception optical module, comprising:

an optical transmission subassembly including a light-emitting element and a monitor light-receiving element for monitoring an optical output of the light-emitting element;

an optical reception subassembly including a light-receiving element and a preamplifying element for amplifying an output of the light-receiving element; and a circuit board for controlling the optical transmission subassembly and the optical reception subassembly, wherein:

a circuit board main body, an optical transmission subassembly fixation region, and an optical reception subassembly fixation region are comprised of rigid substrates; and the circuit board main body is connected with the optical transmission subassembly fixation region and the optical reception subassembly fixation region through flexible substrates, wherein a driver for driving the optical transmission subassembly, and a waveform-shaping IC for transmission purposes for shaping a waveform of an electrical signal input to the optical transmission subassembly are mounted on the optical transmission subassembly fixation region, and wherein a control circuit for controlling the optical transmission subassembly and the optical reception subassembly, and a waveform-shaping IC for reception purposes for shaping a waveform of an electrical signal output from the optical reception subassembly are mounted on the circuit board main body.

7. The transmission/reception optical module, as claimed in claim 6, wherein the circuit board is divided into two sections, and one section of the circuit board is connected with the other section of the circuit board through at least one of the flexible substrates.

* * * * *